United States Patent
Kakuishi et al.

Patent Number: 5,617,450
Date of Patent: Apr. 1, 1997

[54] DIGITAL SUBSCRIBER LOOP INTERFACE UNIT

[75] Inventors: Mitsuo Kakuishi, Kawasaki; Yutaka Awata, Kanagawa; Nobukazu Koizumi, Kawasaki, all of Japan

[73] Assignee: Fujitsu Limited, Kanagawa, Japan

[21] Appl. No.: 288,358

[22] Filed: Aug. 10, 1994

[30] Foreign Application Priority Data

Oct. 26, 1993 [JP] Japan .................. 5-267148

[51] Int. Cl.⁶ .......................................... H03H 7/30
[52] U.S. Cl. .................. 375/230; 375/233; 375/232; 364/724.19; 364/724.2
[58] Field of Search .................. 375/232, 233, 375/230, 229, 234, 350, 231; 379/410; 333/18; 370/32, 32.1; 364/724.16, 724.19, 724.2, 724.17

[56] References Cited

U.S. PATENT DOCUMENTS

| | | | |
|---|---|---|---|
| 5,029,167 | 7/1991 | Arnon et al. | 375/233 |
| 5,327,459 | 7/1994 | Hara et al. | 375/232 |
| 5,481,564 | 1/1996 | Kakuishi et al. | 375/232 |
| 5,493,585 | 2/1996 | Leverington et al. | 375/232 |

*Primary Examiner*—Wellington Chin
*Assistant Examiner*—Jean B. Corrielus

[57] ABSTRACT

A digital subscriber loop interface unit, connected to a digital subscriber loop, includes an echo canceler for carrying out a echo canceling operation, a decision feedback equalizer for carrying out an equalizing operation, and a transversal filter, provided in at least one of the echo canceler and the decision feedback equalizer, in which a plurality of taps among all taps are grouped into groups, each group including a predetermined number of taps continuously arranged, a single tap coefficient being assigned to the taps in each group. A digital subscriber loop interface unit may include an echo canceler for carrying out a echo canceling operation by using a value obtained by adding +1 to a symbol value represented by a 2B1Q code. Further, the echo canceler may have a jitter echo canceler in which a convolution operation is carried out by using a value obtained by adding +1 to a symbol value represented by the 2B1Q code, the tap coefficient used in the convolution operation is changed in accordance with a time elapsing from occurrence of the jitter. Furthermore, a digital subscriber loop interface unit may have a low-pass filter in which a filter coefficient is changed based on whether the decision feedback equalizer is in or after a pull-in step.

3 Claims, 17 Drawing Sheets

| A+B+C | S | a3 | a2 | a1 | a0 | S2 | B1 | B2 | S3 |
|---|---|---|---|---|---|---|---|---|---|
| +9 | 0 | 1 | 0 | 0 | 1 | 0 | 1 | 1 | 0 |
| +7 | 0 | 0 | 1 | 1 | 1 | 0 | 1 | 1 | 1 |
| +5 | 0 | 0 | 1 | 0 | 1 | 0 | 1 | 0 | 0 |
| +3 | 0 | 0 | 0 | 1 | 1 | 0 | 0 | 1 | 0 |
| +1 | 0 | 0 | 0 | 0 | 1 | 0 | 0 | 1 | 1 |
| −1 | 1 | 1 | 1 | 1 | 1 | 1 | 0 | 1 | 0 |
| −3 | 1 | 1 | 1 | 0 | 1 | 1 | 0 | 1 | 1 |
| −5 | 1 | 1 | 0 | 1 | 1 | 1 | 1 | 0 | 1 |
| −7 | 1 | 1 | 0 | 0 | 1 | 1 | 1 | 1 | 0 |
| −9 | 1 | 0 | 1 | 1 | 1 | 1 | 1 | 1 | 1 |

DIGITAL SUBSCRIBER LOOP INTERFACE UNIT

BACKGROUND OF THE INVENTION (1) Field of the Invention

The present invention generally relates to a digital subscriber loop interface unit, and more particularly to a digital subscriber loop interface transmitting and receiving information represented by the 2B1Q codes.

(2) Description of the Related Art

In a case where a digital subscriber loop interface unit transmits digital signals represented by the 2B1Q codes using a twisted pair cable like an existing telephone subscriber loop, each transmission path code symbol is one of four values +3, +1, −1, and −3. In addition, for example, a baud rate of 80 kHz is selected as the transmission rate. In such a digital subscriber loop interface unit using the 2B1Q codes, it is required to effectively carry out an echo canceling process and an equalizing process for the input signals.

A conventional digital subscriber loop interface unit using the 2B1Q codes are formed, for example, as shown in FIG. 1. Referring to FIG. 1, the digital subscriber loop interface unit has a hybrid circuit (HYB) 102 connected to a subscriber loop 101, an analog-to-digital converter (A/D) 103, a high pass filter (HPF) 104, an AGC amplifier (AGC) 105, a low pass filter (LPF) 106, a decision feedback equalizer 109. The decision feedback equalizer 109 is formed of a discriminator (DEC) 107 and a transversal equalizer (EQL) 108. The digital subscriber also has a driver (DV) 110, an echo canceler 111 and a digital-to-analog converter (D/A) 115. The echo canceler 111 has a linear echo canceler (LEC) 112, a non-linear echo canceler (NEC) 113 and a jitter echo canceler (JEC) 114.

A transmission signal S(n) is converted, by the digital-to-analog converter 115, into an analog signal having an amplitude which is one of values ±3 and ±1. The analog signal is supplied from the driver 110 to the subscriber loop 101 via the hybrid circuit 102. A received signal from the subscriber loop 101 is supplied to the analog-to-digital converter 103 via the hybrid circuit 102 so as to be converted into a digital signal in accordance with, for example, an over-sampling analog-to-digital converting technique in the analog-to-digital converter 103. The wave-shaping and the elimination of low-frequency components are then carried out by the high pass filter 104.

Echo components of the received signal is removed from the received signal by the echo canceler 111. The received signal is amplified by the AGC amplifier 105 so as to have a predetermined level and is supplied to the decision feedback equalizer (DFE) 109 via the low pass filter 106. The decision feedback equalizer (DFE) 102 removes inter-symbol interference from the received signal so that data is reproduced.

In a case where the AMI (Alternate Mark Inversion) codes which do not includes DC components are used as transmission codes, even if the hybrid circuit 102 is formed of a hybrid transformer cutting off the DC components, wave form distortion does not occur. On the other hand, in a case where the 2B1Q codes including DC components, if the DC component is cut of the by the hybrid transformer of the hybrid circuit 102, the wave form distortion occurs. As a result, an impulse response shows a characteristic having a long tail. Thus, it is required to increase the number of taps of each of transversal filters in the echo canceler 111 and the decision feedback equalizer 109. In the transversal filter having a large number of taps, the size thereof is large and a large amount of processing is needed so that the dissipation power is increased.

To reduce a degree of the long tail in the impulse response, it is thinkable that the inductance of the hybrid transformer is increased so that the attenuation of the low frequency components is as smaller as possible. However, the hybrid transformer is made larger, so that problems of the cost and volume occur.

Thus, as shown in FIG. 2, it has been known that a primary recursive filter (an IIR filter (Infinite Impulse Response filter)) 121 is added to the transversal filter. Referring to FIG. 2, the transversal filter has a plurality of delay elements (D), multipliers (×) and an adder (Σ) 120. Each of the delay elements (D) delays an input signal by a delay time corresponding to the baud rate. The primary recursive filter 121 has a adder (+), a multiplier (×) and a delay element (D). At respective taps each of which is between adjacent delay elements (D), symbols P(n)–P(n–M–1) sampled at sampling times n–(n–M–1) are obtained. The respective taps are connected to the multipliers (×), so that the multipliers (×) respectively multiplies the symbols P(n)–P(n–M) by tap coefficients $CE_1$–$CE_M$. Multiplying signals output from the multipliers (×) are supplied to the adder (Σ) 120 and added to each other. The symbol P(n–M–1) sampled at the sampling time (n–M–1) and a tap coefficient $CE_{M+1}$ are multiplied by the multiplier (×), and the multiplying signal is supplied to the primary recursive filter 121. An output signal of the primary recursive filter 121 is added to an adding output signal from the adder (Σ) 120 by an adder (+). A adding result at the adder (+) is obtained as an equalizing output signal y(n). The tap coefficient $CE_{M+1}$ and an attenuation factor are supplied, as parameters, to the primary recursive filter 121. The attenuation factor corresponding to the long tail of the impulse response is equal to or greater than 0.95 and is less than 1.

FIG. 3 shows a unit in which an updating circuit for updating the tap coefficients to be supplied to the transversal filter is added to the circuit shown in FIG. 2. In FIG. 3, those parts which are the same those shown in FIG. 2 are given the same reference numbers. Referring to FIG. 3, an equalizing error signal k·e(n), obtained by multiplying an error signal e(n) at a sampling time n and a step size k, is supplied to the transversal filter. The symbol P(n) of the received signal at the sampling time n is successively delayed by the delay elements (D) serially connected to each other. The output signals at the respective taps each of which is between adjacent delay elements (D) are multiplied by the equalizing error signal k·e(n). Each of the multiplying signals is added to a tap coefficient delayed by one period of sampling time, and the adding result is multiplied, one of tap coefficient $CE_1$–$CE_{M+1}$, by the signal at each tap.

FIG. 4 shows an impulse response of the received signal. In FIG. 4, the axis of ordinate represents an amplitude and the axis of abscissa represents a baud rate time. In addition, a continuous line represents an impulse response in a case where the hybrid transformer has a large inductance, and a dotted line represents an impulse response in a case where the hybrid transformer has a small inductance. Since the hybrid transformer cuts off DC components, the tail of the impulse response generally becomes long. For example, in the case where the hybrid transformer has a large inductance, as indicated by the continuous line, the impulse response proceeds to an attenuation characteristic from a time corresponding to about eighteen taps. On the other hand, in the case where the hybrid transformer has a small inductance, as indicated by the dotted line, the impulse response proceeds to an attenuation characteristic from a time corresponding to about thirty taps.

Referring to the impulse responses indicated by the continuous line and the dotted line in FIG. 4, in the case where the hybrid transformer has the small inductance, the time from which the impulse response proceeds to the attenuation characteristic is delayed in comparison with in the case where the hybrid transformer has the large inductance. As a result, the tail of the impulse response in the case where the hybrid transformer has the small inductance is longer than the tail of the impulse response in the case where the hybrid transformer has the large inductance. In addition, the primary recursive filter 121 acts on a region in which the impulse response is exponentially attenuated. Thus, in the case the hybrid transformer having the small inductance is used, the number of taps located previous to the primary recursive filter 121 must be greater than the number of taps in the case where the hybrid transformer having the large inductance is used.

FIG. 5 shows essential parts of a conventional decision feedback equalizer. Referring to FIG. 5, the decision feedback equalizer has a plurality of delay elements (D), an adder ($\Sigma$) 130, a discriminator 131, adders (+) and multipliers (×). Each of the delay elements (D) delays an input signal by a delay time corresponding to the baud rate. When a received signal x(n) is supplied to the decision feedback equalizer, the decision feedback equalizer outputs a received symbol P(n). An equalizing error signal e(n) is generated and the a feedback error signal k·e(n) is made by using the equalizing error signal e(n).

Received symbols P(n−1)−P(n−N) are respectively multiplied by tap coefficients $Cd_1$−$Cd_N$, and the multiplying signals are added to each other by the adder 130. The adding result is output as an equaling signal y(n) from the adder 130. The equalizing signal y(n) is subtracted from the received signal x(n) so that the received signal x(n) is equalized. The equalized signal is supplied to the discriminator 131, and the discriminating result obtained by the discriminator 131 is used as the received symbol P(n). The decision feedback equalizer is applicable to various types of transmission apparatuses other than the digital subscriber loop interface unit.

In the decision feedback equalizer, a symbol value (A) is multiplied by a tap coefficient (B), and a number (C) is added to the multiplying result. In this case, one of values ±3 and ±1 is multiplied, as the symbol value (A), by the tap coefficient. Thus, the above calculating process can be carried out by using a 3-inputs adder and a shifter. In addition, it has been known that, in processes in a high pass filter and a low pass filter, a received signal having a plurality of bits and a filter coefficient are multiplied by each other using a shifting process in which the filter coefficient represented by an exponent of "2" is shifted.

In the decision feedback equalizer and the echo canceler in the digital subscriber loop interface unit, the total number of taps is fifty or more. A multiplying process and an adding process must be performed for each tap. Thus, the large number of processes is needed. To simplify processes, the following technique has been proposed (e.g. U.S. Pat. No. 4,926,472).

"+1" is added to each of four kinds of symbol values ±3 and ±1 of the 2B1Q code so that new four kinds of symbol values 4, 2, 0 and −2 ($2^2$, $2^1$, 0, $-2^1$) are obtained. According to a set of the new four kinds of symbol values, a process for each tap can be performed by using a 2-inputs adder and a shifter. A set of these new symbol values are referred to, for example, as a "symbol value +1".

Essential parts of a conventional decision feedback equalizer using the "symbol value +1" are shown in FIG. 6. In FIG. 6, those parts which are the same as those shown in FIG. 5 are given the same reference numbers. Referring to FIG. 6, "1" is added to a received symbol P(n) which is discriminated by the discriminator 131 so that the symbol values ±3 and ±1 of the 2B1Q code is converted into symbol values 4, 2, 0 and −2. A DC (direct-current) correction part 132 corrects a difference between results of operations using the symbol values 4, 2, 0, and −2 obtained by adding +1 to the original symbol values ±3 and ±1 of the 2B1Q code and results of operations using the original symbol values of the 2B1Q, the operations including a convolution operation and an updating operation of the tap coefficients.

When a j-th tap coefficient, an equalizing error signal and a symbol value at a sampling time n are respectively represented by $Cd_j(n)$, e(n) and P(n), the j-th tap coefficient $Cd_j(n+1)$ at a sampling time (n+1) is represented as follows.

$$Cd_j(n+1)=Cd_j(n)+k\cdot e(n)\cdot[P(n-j)+1] \qquad (1)$$

In addition, the relationship between a tap coefficient Dd(n) at the sampling time n and a tap coefficient Dd(n+1) at the sampling time (n+1), in the DC correction part 132, is represented as follows.

$$Dd(n+1)=Dd(n)+k\cdot e(n) \qquad (2)$$

FIG. 7 shows a conventional jitter echo canceler in a case where the high pass filter has three taps. Referring to FIG. 7, the jitter echo canceler has an adder ($\Sigma$) 140, switches $141_1$−$141_M$, delay elements (D) and multipliers (×). The symbol P(n) and tap coefficients $CJ_{11}$−$CJ_{M3}$ are supplied to this jitter echo canceler.

When insertion or deletion of pulses is performed to obtain a phase locked state in a DPLL (digital phase lock loop), received sampling point is varied. After this, an echo wave form is distorted for a while. To deal with the distortion of the echo wave form, the jitter echo canceler is provided in the digital subscriber loop interface unit. After jitter occurs to cancel the distortion of the echo wave form caused by the variation of sampling points, the convolution operation is performed using all the taps. After this, the switches $141_1$−$141_M$ are controlled so that the number of taps applied to the convolution operation is decreased one by one. That is, the echo of a transmission code output before the jitter occurs is returned after the jitter has occurred (after the sampling time is changed), and the value of the echo differs from the value of the echo obtained in a case of no jitter since the sampling time is changed. To correct this difference, the jitter echo canceler is operated in addition to the linear echo canceler and the non-linear echo canceler.

Then, after the jitter has occurred, the transmission signal is transmitted in synchronism with new sampling times, so that the echo of the transmission signal output after the jitter has occurred is corrected by only the linear echo canceler and the non-linear echo canceler.

The output of the jitter echo canceler is a function of the transmission code S(n), and the impulse response is at an approximately constant value after I periods have elapsed from a time at which the jitter has occurred. The output of the jitter echo canceler is obtained by carrying out the convolution operation until the variation of the amplitude cased by changing the sampling time is out for M periods. That is, the output y(I) obtained after the I periods had elapsed from the time at which the jitter has occurred is represented as follows.

$$y(I)=[\Sigma_{j=1}^{M}\{CJ_{Ij}\cdot S(I-j)\}]\cdot jdr \qquad (3)$$

In the above equation, $\Sigma_j = 1^M$ means an adding operation from $j=1$ to $j=M$, that is, indicates the convolution operation. The number I of periods falls within a rage 1–M (1, 2, . . . , and M), and "jdr" represents a direction of the jitter and has 1 or −1. The value of the "jdr" is determined as 1 or −1 based on whether, in the DPLL circuit (not shown in figures), the pulse insertion is performed to advance the sampling phase or the pulse deletion is performed to delay the sampling phase. S(I−j) represents the transmission code as a function of the number I of periods which have elapsed, and S(1) represents the transmission code immediately after the jitter has occurred.

The tap coefficient $CJ_{Ij}$ is represented as a function of the number I of periods, because the high pass filter formed of the transversal filter is provided at a front end of the jitter echo canceler. For example, in a case where the jitter occurs at a time n, the echo related to the transmission code previous to the P(n−1) is affected by changing the sampling time. However, even if the echo is related to the transmission code previous to P(n−1), signals which have been already stored in the delay elements in the high pass filter are not affected. Thus, until the signals are output from the high pass filter, the tap coefficients of the jitter echo canceler are not constant, and after this, the tap coefficients becomes constant. Thus, when representing the number of taps of the transversal filter forming the high pass filter as K, the tap coefficient $CJ_{Ij}$ is constant in a rage of $I \geq K$.

In an example of the conventional jitter echo canceler shown in FIG. 7, the number K of the taps of the high pass filter is set at 3. The switches $141_1 - 141_M$ are switched as shown in FIG. 7 at a time corresponding to the period I=1. Thus, the tap coefficients $CJ_{11} - Cj_{M1}$ are supplied to this jitter echo canceler. In the next period I=2, the tap coefficients $CJ_{22} - CJ_{M2}$ are supplied thereto. In the period I=3, the tap coefficients $CJ_{33} - CJ_{M3}$ are supplied thereto, and in the period I=4, the tap coefficients $CJ_{43} - CJ_{M3}$ are supplied to this jitter echo canceler.

The updating equation, corresponding to the equation (3), for the tap coefficient is represented as follows.

$$CJ_{Ij}(I+1) = CJ_{Ij}(I) + k \cdot e(n) \cdot S(I-j) \cdot jdr \quad (4)$$

In a rage of $I \geq K$, $$CJ_{Ij} = CJ_{Kj} \quad (5)$$

stands, where K is the number of taps of the high pass filter.

In the digital subscriber loop interface unit shown in FIG. 1, the low pass filter 106 at the front end of the decision feedback equalizer 109 forms a wave of post-cursor portion after the main pulse. Hereinafter the low pass filter 106 is referred to as a post-cursor equalizer. The transfer function of this post-cursor equalizer can be represented by $$1/(1-a \cdot z^-). \quad (6)$$

The filter coefficient a is equal to zero (a=0) when the cable length is minimum, and the filter coefficient a is equal to 0.75 (a=0.75) when the cable length is maximum.

It can be determined, based on the gain of the AGC amplifier 105, whether or not the cable length is large or small. When the cable length is large, the received signal is attenuated. Thus, the AGC amplifier 105 amplifies the received signal with a large gain. On the other hand, when the cable length is small, the received signal is not almost attenuated, so that the AGC amplifier 105 amplifies the received signal with a small gain. Thus, in accordance with the gain of the AGC amplifier 105, the filter coefficient a of the post-cursor equalizer is changed. In a case where the above post-cursor equalizer is used, there is a problem in that a pull-in time (a time required to obtain a signal converging on a stable state) in a case of using a long cable may be greater than that in a case of using a short cable. Because the gain of the AGC amplifier is large in use of the long cable as has been described above, noise components are also enlarged so that a noise error becomes large, the pull-in time may be large.

The problem of the long pull-in time may also depend on the difference between the main pulse forms in use of the long cable and in use of the short cable. the impulse response at the output of the low pass filter 106 is shown in FIG. 18. In the case where the length of the cable is large, the half width of the main pulse is greater than the baud rate period T, as shown in FIG. 18(a). On the other hand, in the case where the length of the cable is small, the half of the main pulse is less than the baud rate period T, as shown in FIG. 18(b). Due to changing the parameter a of the high pass filter 104, the half width of the main pulse can be close to th baud rate period T. However, the parameter of the high pass filter 104 is set at a value so that the whole post-cursor portion of the impulse response, rather than the width of the main pulse, has a pulse amplitude in post-cursor range as small as possible. Thus, when the length of the cable is large as has been described above, the half width of the main pulse in the impulse response is large.

The sampling phase is generally not constant at start of the pull-in operation, so that the optimum sampling phase is searched for by moving the sampling point in a time axis in the phase extracting circuit (not shown in figures). According to an algorithm of the decision feedback equalizer, the main-cursor (the main response) corresponds to an amplitude at a sampling time at which the maximum value is obtained among a plurality of sampling values sampled every baud rate period T. The pre-cursor corresponds to an amplitude at a time previous by T to the sampling time at which the main-cursor is obtained. The sampling phase corresponding to the pre-cursor is normally determined at zero. The post-cursor corresponds to an amplitude at each of times delaying from the main-cursor by nT where n represents positive integers. For example, in FIG. 8(a) and (b), the pre-cursor is zero and sampling points a1 and b1 delaying from the precursor by the period T is the optimum phases for the pull-in process.

The sampling points a1 and a3 are separated by the period T, and the amplitudes at the sampling points a1 and a3 are equal to each other. The sampling points b1 and b3 has the same relationships as the sampling points a1 and a3. In this case, if the pull-in process starts from a sampling phase which is prior to the optimum sampling points a1 and b1 and after the sampling points a2 and b2, a value at a sampling point further previous by the period T to each of the sampling points a2 and b2 is negative. Thus, a phase control is carried out so that the sampling phase is delayed. On the other hand, if the pull-in process starts from a sampling phase which is after the optimum sampling points a1 and b1 and prior to the sampling points a3 and b3, a value at a sampling point previous by the period T to each of the sampling points a3 and b3 is positive. Thus, a phase control is carried out so that the sampling phase advances. Thus, in both the case, the phase control is carried out so that the sampling phase is brought close to each of the optimum sampling points a1 and b1. However, in a case where the main pulse is wide, the difference between the amplitude at each of the sampling points a2 and a3 and the amplitude at the optimum sampling point a1 is small, so that both the amplitudes are large in a wide range. As a result, it is not clear which amplitude corresponds to the main response. Thus, the pull-in time is increased.

In a case shown in FIG. 8(b), the amplitude at each of the sampling points b2 and b3 is less than the amplitude at the optimum sampling point b1. If sampling points are slightly moved from the phases including the sampling points b2 and b3, the amplitude at one sampling point is much larger than the amplitude at another sampling point. As a result, it is clear which sampling point corresponds to the main pulse. Thus, the pull-in time can be short.

In concrete terms, in the case where the length of the cable is large, the frequency at which decision errors occur in initial step of the pull-in process in the decision feedback equalizer is lager than the frequency at which the decision errors occur in the case where the length of the cable is short. Thus, a long time is required to obtain right tap coefficients in the coefficient updating operation represented by the equation (1).

In the conventional digital subscriber loop interface unit formed as shown in FIG. 1, the 2B1Q code is used for the transmission of information. Since the hybrid circuit 102 is formed of the hybrid transformer, the transmission characteristic depends on the impedance of each of the hybrid transformers in both the transmitting side unit and the receiving side unit. Thus, even if the recursive filter is used, the number of taps of each of the echo canceler 111 and the decision feedback equalizer 109 must be twenty four or more. That is, the recursive filter is used only as aid.

In a subscriber side of the digital subscriber loop interface unit, after the pull-in process in the echo canceler 111 is completed by using the transmission signal to be transmitted to a destination, the taps of the echo canceler 111 are fixed. The pull-in process in the decision feedback equalizer 109 is then performed using the received signal. In the switching unit side, the transmission timing is fixed, so that the sampling phase must be synchronized with the timing of the received signal. Thus, the sneak time of the echo can not be fixed. As a result, in the pull-in process, the number of taps of both the echo canceler 111 and the decision feedback equalizer must be simultaneously updated.

In this case, if the tap coefficients are updated using the "symbol value +1" as the symbol in both the echo canceler 111 and the decision feedback equalizer 109, there is a case where the pull-in is incomplete. This is caused by using the same error in both the echo canceler 111 and the decision feedback equalizer 109. In general, each tap coefficient is calculated by based on the correlation between the symbol P(n−j) +1 and the error e(n) as indicated by the equation (1). In the echo canceler 111, the tap coefficients are obtained by using the transmission symbol, and in the decision feedback equalizer 109, the tap coefficients are obtained by using symbols reproduced from the received signals. That is, the tap coefficients are separately obtained in the echo canceler 111 and the decision feedback equalizer 109.

However, the value of the DC correction part indicated by the equation (2) depends on only the error e(n). When the pull-in processes in the echo canceler 111 and the decision feedback equalizer 109 are simultaneously performed using the same error e(n), the respective DC correction parts performs the same process. As a result, in the respective echo canceler 111 and the decision feedback equalizer 109, the correction of DC components required by them are not always performed.

In addition, the echo canceler 111 has the non-linear echo canceler 113 which functions as the DC correction part. As a result, the echo canceler 111 may not be provided with the DC correction part. On the other hand, in the decision feedback equalizer 109, since the DC component are not ignored, the decision feedback equalizer 109 must be provided with the DC correction part for correcting the DC components.

As has been described above, in a case where both the echo canceler 111 and the decision feedback equalizer 109 carries out the convolution operation and the updating operation of the tap coefficient using the "symbol value +1", both the echo canceler 111 and the decision feedback equalizer 109 are in a state where there is substantially the DC correction part. Thus, in an initial state and/or in an step size, the tap coefficients are updated so that the non-linear echo canceler 113 corrects DC components which should be corrected by the DC correction part of the decision feedback equalizer 109. As a result, the tap coefficients reach limited value, and the non-linear echo canceler 113 can not perform the correction of non-linear components to be processed. In this case, the pull-in may be incomplete.

The tap coefficients of the transversal transformer of the decision feedback equalizer 109 correspond to the post-cursor portion of the impulse response, but the transversal transformer has no tap coefficients corresponding to the pre-cursor and the main-cursor. If the value of the DC correction part is limited to an item corresponding to the post-cursor (the value of the DC correction part is the sum of coefficients of only the post-cursor portion, and is close to "1" not close to zero.), the calculation of [(the value of the main-cursor)×(the symbol value P(n)] must be performed when the error is calculated. As a result, the number of calculations can not be decreased.

If the term corresponding to the main-cursor is considered as the DC correction part, the value of the DC correction part is close to zero. In this case, the error e(n) is obtained in accordance with a calculation [(the main-cursor value $Cd_0$)× (the new symbol P(n)+1)]. As a result, the number of calculation is not increased. However, in this case, the control of the pull-in is complex. For example, before the pull-in of the tap coefficients in the decision feedback equalizer 109 is performed, the tap coefficient $Cd_0$ corresponding to the main-cursor is calculated in a state where the tap coefficient corresponding to the post-cursor in the decision feedback equalizer 109 is maintained at zero. The AGC gain is then determined so that the calculated tap coefficient $Cd_0$ falls within a predetermined range. If this AGC process is performed, since the coefficient value $Cd_0$ corresponding to the main-cursor is not zero, the DC correction part can not be zero. The value of the DC correction part obtained when the AGC process is completed is approximately the same as the value of the main-cursor so as to be greatly different from zero. After this, the pull-in of the tap coefficient in the decision feedback equalizer 109 is performed. When the tap coefficient corresponding to the post-cursor is close to the final value, the DC correction part is gradually varied to a value close to zero.

As has been described above, the DC correction part in the decision feedback equalizer 109 has a large value once in the pull-in process, and is then varied so as to return to zero. Since the coefficient varies complexly as this, the step size must be filly controlled. As a result, the control is complex and the time required for the pull-in process is long.

Although the linear echo canceler 112 has about thirty taps, the jitter echo canceler 114 forming a part of the echo canceler 111 has the number of taps falling within 7–9. The convolution range is varied with elapsing time, so that the tap coefficients are not constant. Thus, even if the "symbol value +1" is applied to the jitter echo canceler 114, the DC correction part which is unchangeable with time can not respond to the "symbol value +1". That is, the "symbol value +1" can not be applied to the conventional jitter echo canceler 114.

The characteristics of the post-cursor equalizer (the low-pass filter 106) is selected so that the post-cursor portion of the impulse response, that is, the tail of the impulse response has a predetermined shape. Thus, if the cable is long, the emphasis of the high frequency components is insufficient so that the main pulse expands. As a result, the probability that an error occurs in the decision feedback equalizer 109 immediately after the pull-in process starts is increased, and the time required for the pull-in process is long.

SUMMARY OF THE INVENTION

Accordingly, a general object of the present invention is to provide a novel and useful digital subscriber loop interface unit in which the disadvantages of the aforementioned prior art are eliminated.

The more specific object of the present invention is to provide a digital subscriber loop interface unit in which characteristics of the echo canceler and the decision feedback equalizer can be improved without substantially increasing the number of taps.

The above objects of the present invention are achieved by a digital subscriber loop interface unit connected to a digital subscriber loop, comprising: an echo canceler for carrying out a echo canceling operation; a decision feedback equalizer for carrying out an equalizing operation; and a transversal filter, provided in at least one of the echo canceler and the decision feedback equalizer, in which a plurality of taps among all taps are grouped into groups, each group including a predetermined number of taps continuously arranged, a single tap coefficient being assigned to the taps in each group.

According to the present invention, the characteristics of the echo canceler and the decision feedback equalizer can be improved without substantially increasing the number of taps.

The digital subscriber loop interface unit may comprise an echo canceler for carrying out a echo canceling operation by using a value obtained by adding +1 to a symbol value represented by a 2B1Q code; and a decision feedback equalizer for carrying out an equalizing operation.

According to the present invention, as a value obtained by adding +1 to a symbol value represented by the 2B1Q is used, the operation can be easily performed in the echo canceler.

In the digital subscriber loop interface unit, the decision feedback equalizer carries out the equalizing operation, in a pull-in step, by using a part of all the taps in which operation a symbol value represented by a 2B1Q code is used, and the decision feedback equalizer carries out the equalizing operation, after the pull-in step, by using all the taps in which operation a value obtained by adding +1 to a symbol value represented by the 2B1Q code.

According to the present invention, the pull-in step can be easily accomplished and the operation can be easily performed in the decision feedback equalizer.

The digital subscriber loop interface may comprise an echo canceler for carrying out an echo canceling operation; and a decision feedback equalizer for carrying out an equalizing operation, wherein the echo canceler has a jitter echo canceler for eliminating from a received signal echo components based on a jitter, the jitter echo canceler having: means for carrying out a convolution operation by using a value obtained by adding +1 to a symbol value represented by the 2B1Q code; means form changing the tap coefficient used in the convolution operation in accordance with a time elapsing from occurrence of the jitter; and a DC correction part to which "1" is always supplied and for changing a tap coefficient used therein in accordance with a time elapsing from occurrence of the jitter.

According to the present invention, the operation can be easily performed in the jitter echo canceler.

The digital subscriber loop interface may comprise an echo canceler for carrying out an echo canceling operation; a decision feedback equalizer for carrying out an equalizing operation; and a low-pass filter to which a signal processed by the echo canceler is supplied and for supplying a signal processed by the low-pass filter to the decision feedback equalizer, the low-pass filter having: means for changing a filter coefficient in accordance with a length of the digital subscriber loop; and means for changing the filter coefficient based on whether the decision feedback equalizer is in or after a pull-in step.

According to the present invention, even if the digital subscriber loop is long, the pull-in step can be easily accomplished in the decision feedback equalizer.

Additional objects, features and advantages of the present invention will become apparent from the following detailed description when read in conjunction with the accompanying drawings.

DESCRIPTION OF THE PREFERRED EMBODIMENTS

A description will be given of the principle of each of embodiments of the present invention.

Figure 9:
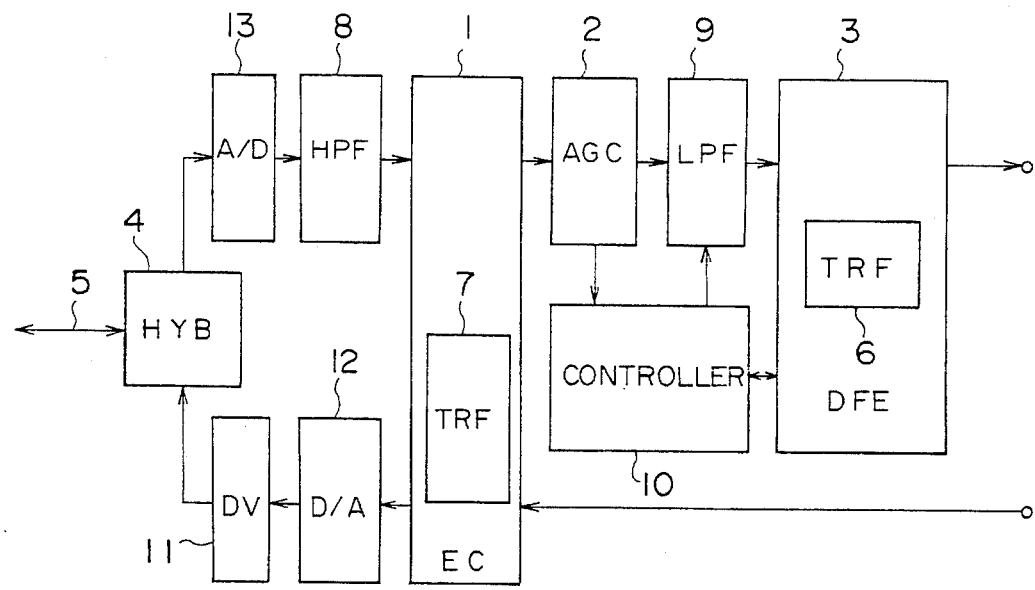
FIG. 9 is a block diagram illustrating the principle of a digital subscriber loop unit according to the present invention.

FIG. 9 shows a digital subscriber loop interface unit. Referring to FIG. 9, the digital subscriber loop interface unit has an echo canceler 1, a decision feedback equalizer 3 and a hybrid circuit connected to a digital subscriber loop 5. The digital subscriber loop interface performs transmitting and receiving information via the digital subscriber loop 5 by using the 2B1Q codes. The echo canceler 1 and the decision feedback equalizer 3 respectively have transversal filters (TRF) 6 and 7 in each of which respective symbols for a plurality of taps are multiplied by tap coefficients and multiplying results are added to each other. A plurality of taps which are at least a part of all the taps of a transversal filter of at least one of the echo canceler 1 and the decision feedback equalizer are grouped into groups so that each group includes a predetermined number of taps continuously arranged. The same tap coefficient is assigned to the taps in each group. The digital subscriber loop interface unit has also a high-pass filter (HPF) 8, a low-pass filter (LPF) 9, a controller 10, a driver 11, a digital-to-analog converter (D/A) 12 and an analog-to-digital converter 13.

In the above digital subscriber loop interface unit, the echo canceler 1 forms an echo replica used to cancel the echo of the transmission signal. The decision feedback equalizer 3 carries out the equalizing process so that the inter-symbol interference of the received signal is canceled. At this time, in taps corresponding to the tail portion of the transversal filter, the same tap coefficient is assigned to the taps in each group.

Furthermore, in the above digital subscriber loop interface unit, the tap coefficient assigned to the taps in each group may be updated by using a symbol for one of the taps in each group.

Each group includes for example, three taps to which the same tap coefficient is assigned. The tap coefficient is updated by using a symbol for one of the three taps in each group. In this case, even if a symbol for any tap among the three taps is used to update the tap coefficient, the same result is obtained.

The above digital subscriber loop interface unit may be provided with an operational logic circuit for performing a convolution operation of symbols for the taps in each group, the operational logic circuit being formed of a shifter and an adder.

In a case where the number of taps included in each group is three, when the convolution operation of symbols for three taps in each group is performed, a result of adding symbols for the three taps represented by the 2B1Q codes is one of ten values $\pm 9$, $\pm 7$, $\pm 5$, $\pm 3$ and $\pm 1$. The values are respectively represented by $\pm(2^3+2^0)$, $\pm(2^3-2^0)$, $\pm(2^2+2^0)$, $\pm(2^1+2^0)$ and $\pm(2^1-2^0)$. Thus, the operation logic circuit can be formed of a 3-input adder and a shifter so that the convolution operation for a plurality of taps can be performed in one machine cycle.

The digital subscriber loop interface unit has at least the echo canceler 1, the AGC amplifier 2, the decision feedback equalizer 3 and the hybrid circuit 4 connected to the digital subscriber loop 5 and transmits and receives information via the digital subscriber loop 5 by using the 2B1Q codes. In this digital subscriber loop unit, the echo canceler 1 may carry out an echo canceling process by using a value obtained by adding +1 to a symbol value represented by the 2B1Q code. The decision feedback equalizer 3 may perform, in a pull-in step, an equalizing process by using a part of the total number of taps and a symbol value represented by the 2B1Q code, and may perform, after the pull-in step, the equalizing process by using total number of taps and a value obtained by adding +1 to the symbol value represented by the 2B1Q code.

In the pull-in step, the decision feedback equalizer 3 uses symbols represented by the 2B1Q codes and uses a number of taps equal to or less than a number a half as many as the total number of taps. In this case, the process in the DC correction part can be omitted and the amount of operation can be decreased. After the pull-in step, the decision feedback equalizer 3 uses a value obtained by adding +1 to the symbol value and uses all the taps. At this time, the echo canceler 1 has been already in a stationary state. Thus, the tap coefficient in the non-linear echo canceler corresponding to the DC correction part is greatly slowly updated or the updating operation is in a stop state. The decision feedback equalizer 3 pulls in essential taps including the main cursor, and the tap coefficient including the DC correction part is not irregularly and converges on a value to be corrected.

The digital subscriber loop interface unit has at least the echo canceler 1, the AGC amplifier 2, the decision feedback equalizer 3 and the hybrid circuit 4 connected to the digital subscriber loop 5 and transmits and receives information via the digital subscriber loop 5 by using the 2B1Q codes. In this digital subscriber loop interface unit, the echo canceler may have at least a jitter echo canceler for canceling echo components depending on jitter in which jitter echo canceler the convolution operation is performed by using a value obtained by adding +1 to the symbol value represented by the 2B1Q code. The echo canceler switches taps coefficients in accordance with a time elapsing from the generation of the jitter, and has a DC correction part, to which an input "1" is always supplied, for switching the taps in accordance with a time elapsing from the generation of the jitter.

In the jitter echo canceler which is a part of the echo canceler 3, the range of the convolution operation is varied in accordance with a time elapsing from the generation of the jitter. According to this, the tap coefficient must be varied. Thus, in the DC correction part in a case a value obtained by adding +1 to the symbol value represented by the 2B1Q code is used, the tap coefficient for the tap to which the input "1" is always supplied is changed in accordance with the time elapsing from the generation of the jitter.

The digital subscriber loop interface unit has at least the echo canceler 1, the AGC amplifier 2, the decision feedback equalizer 3, the hybrid circuit 4 connected to the digital subscriber loop 5, the wave shaping high-pass filter (HPF) 8 and the low-pass filter 9 in which filter coefficients are changeable, and transmits and receives information via the digital subscriber loop 5 using the 2B1Q codes. In this digital subscriber loop interface unit, the low-pass filter 9 may change the filter coefficient in accordance with the length of the digital subscriber loop 5, and may change the filter coefficient in accordance with whether the decision feedback equalizer 3 is in the pull-in step or after the pull-in step.

The low-pass filter changes the filter coefficient in accordance with gain of the AGC amplifier 2 so that the post-cursor characteristic of the impulse response is optimized. In the pull-in step in the decision feedback equalizer 3, the filter coefficient is changed so that the main response characteristic of the impulse response is controlled. That is, the filter coefficient is changed so that the pulse width of the main-cursor is decreased. According to this, the decision feedback equalizer 3 can rapidly carries out the pull-in process for obtaining the optimum a sampling phase. The changing of the filter coefficient may be performed by a sequential control in the controller 10.

In the above digital subscriber loop interface unit, the low-pass filter 9 may also change the filter coefficient by stages from starting the pull-in step in the decision feedback equalizer 3 to the end of the pull-in step.

In a case where the filter coefficient of the low-pass filter is changed, if the difference between the filter coefficient and the changed filter coefficient is large, there may be a case where the decision feedback equalizer 3 can not be changed to the last state under a condition in which the pull-in state is being maintained. When the filter coefficient is changed by stages, the difference between the filter coefficient and the changed filter coefficient in every stage is small. Thus, each tap coefficient of the decision feedback equalizer 3 can be converged to the right value under a condition in which the pull-in state is being always maintained.

In the above digital subscriber loop interface unit, a sum of values of exponent of "2" may be decided as the filter coefficient.

According to this, the multiplying operation in the filter operation can be performed by using a shifter and an adder.

A description will now be given, with reference to FIGS. 10, 11A and 11B, of a first embodiment of the present invention. In the first embodiment, an essential part of the echo canceler 1 and/or the decision feedback equalizer 3 shown in FIG. 9 is formed as shown in FIG. 10.

Figure 10:
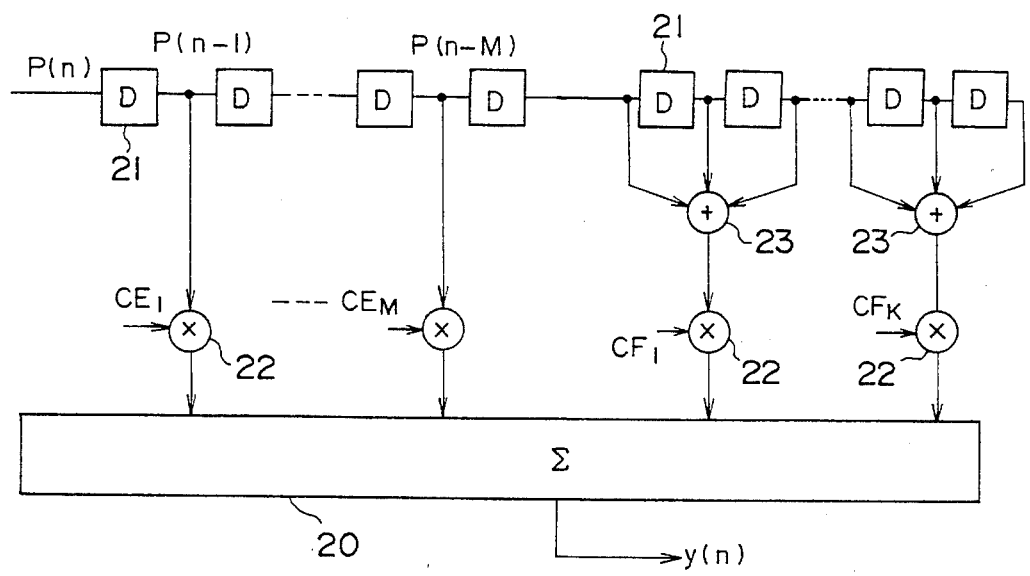
FIG. 10 is a diagram illustrating an essential part of a transversal filter provided in the digital subscriber unit according to a first embodiment of the present invention.

Referring to FIG. 10, there are provided an adder 20 ($\Sigma$), a plurality of delay elements 21 (D), multipliers 22 ($\times$) and adders 23. A received symbol P(n) is obtained at a sampling time n, and an equalizing output signal y(n) is obtained at the sampling time n. Tap coefficients $CE_1$–$CE_M$ and $CF_1$–$CF_K$ are supplied to the multipliers 22.

The tap coefficients $CE_1$–$CE_M$ are respectively assigned to M taps among all the taps. The remaining taps are grouped into K groups each of which includes L taps. The same tap $CF_i$ is assigned to taps in the i-th group (i=1, 2, ... and K). The total number of taps is M+L×K. FIG. 10 shows a case where L is equal to three (L=3).

Thus, the equalizing output signal y(n) is represented as follows.

$$y(n) = \sum_{i=1}^{M} [CE_i \cdot P(n-i)] + \quad (7)$$

$$\sum_{j=1}^{K} [CF_j \cdot \{P(n-M-3j+2) +$$

$$P(n-M-3j+1) + P(n-M-3j)\}]$$

In the above equation, $\Sigma^M_{i=1}$ means an adding operation from i=1 to i=M, and $\Sigma^K_{j=1}$ means an adding operation from j=1 to j=K.

That is, the operation until the M-th tap is the same manner as in the conventional operation, and in the operation starting from the (M+1)-th tap, symbols for every L(=3) taps are respectively multiplied by the same tap coefficient $CF_j$ and the multiplying results are added. This is equivalent to an operation in which the symbols for every L taps are added and the adding result is multiplied by the tap coefficient $CF_j$.

In a case where values ±3 and ±1 of the 2B1Q code is used in the actual convolution operation, the symbols are added by a 3-input adder in one machine cycle. This convolution operation is a product-sum operation, a cumulative value is supplied to a first input terminal, a tap coefficient $CE_i$ is supplied to a second input terminal and a value $2CE_i$ is supplied to a third input terminal. That is, the value obtained by shifting the tap coefficient $CE_i$ by one bit is supplied to the third input terminal. Furthermore, the second and third input terminal are respectively provided with a switch for selecting whether or not the input is inverted and a switch for selecting whether or not the input is made to be zero. According to this, the convolution operation for one tap is carried out every machine cycle.

In a case where the symbols for every L taps are multiplied by the same tap coefficient $CF_j$ and the multiplying results are added, the same operation can be performed in the same manner as in the case of the tap coefficient $CE_i$. However, due to adding the symbols first, the convolution operation for the L taps can be performed in one machine cycle.

That is, since each symbol has one of values ±3 and ±1, the maximum value of the adding result is obtained when all the L symbols are +3, and the maximum value is equal to +3L. The minimum value of the adding result is obtained when all the L symbols are −3, and the minimum value is equal to −3L. When one of the L symbols is ±1, the absolute value of the adding result is reduced by 2. That is, the adding result obtained by adding L symbols to each other is one of the following values: ±3L, ±(3L−2), ±(3L−4), ±(3L−6), ...

For example, in a case where L is equal to 2 (L=2), the adding results: ±6, ±4, ±2 and ±0 may be obtained. In a case where L is equal to 3 (L=3), the adding results:

±9, ±7, ±5, ±3, and ±1 may be obtained. In a case where L is equal to 4 (L=4), the adding results:

±12, ±10, ±8, ±6, ±4, ±2 and ±0 may be obtained.

The adding results in a case where L=2 are represented by $+(2^2+2^1)$, $+2^2+2^1$ and $+0$ The adding results in the case where L=3 are represented by $\pm(2^3+2^0)$, $\pm(2^3-2^0)$, $\pm(2^2+2^0)$, $\pm(2^1+2^0)$ and $\pm(2^1-2^0)$.

That is, any adding result, if L is less than 4, is represented by a value of exponent of "2" or a sum of values of exponent of "2". Thus, if a logic circuit for converting the input symbol into a number of shift operation and a code is provided, the convolution operation can be performed in one machine cycle using the 3-input adder and the shifter.

For example, in a case where L=3, if the symbols for taps continuously arranged are respectively equal to +3, +1 and +3, an adding result is equal to +7. This adding result is represented by $(2^3-2^0)$. Thus, to obtain $2^3$, a shifter connected to the second input terminal of the 3-input adder shifts bit data by 3 bits in a left direction and the shifting result is not inverted. To obtain $2^0$, a shifter connected to the third input terminal of the 3-input adder does not shift bit data and the result is inverted. A scale of a circuit operating in accordance with the above converting logic corresponds to a few ten gates, and the circuit does not include a sequential circuit. Thus, the convolution operation for each L taps can be simultaneous with the operation for each of the M taps.

Figures 11A, 11B:
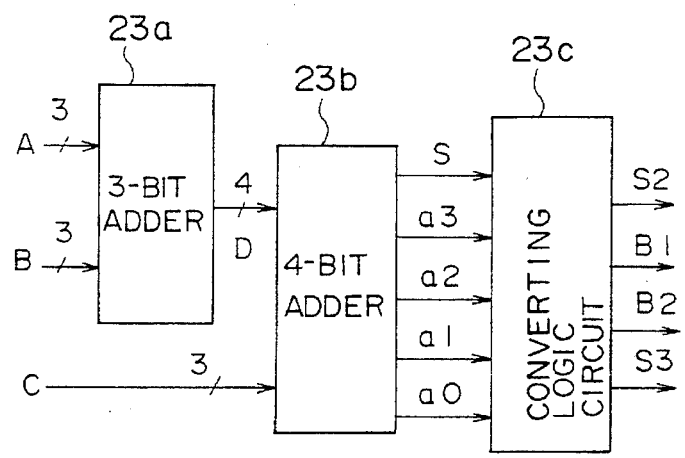
FIG. 11A is a block diagram illustrating a three-input adder used in the transversal filter shown in FIG. 10.
FIG. 11B is a table illustrating relationships between inputs and outputs of the three-input adder shown in FIG. 11A.

FIG. 11A shows functional blocks of the 3-input adder, and FIG. 11B shows a converting logic used in a converting logic circuit shown in FIG. 11A. Referring to FIG. 11A, three data items A, B and C each of which has three bits including a sign bit are supplied to the 3-bit adder. The data times A and B are added by a three bit adder 23a, and an adding output data item D having four bits are obtained. This data item D and the data item C are added by a four bit adder 23b. The result of the calculation (A+B+C) is represented by five bits (S, a3, a2, a1, a0). This adding output data (S, a3, a2, a1, a0) represented by the five bits is one of values ±9, ±7, ±5, ±3 and ±1, and is converted into bits S2, B1, B2, and S3 by a converting logic circuit 23c. That is, the above values of the adding output data are converted into the form of $\pm(2^3+2^0)$, $\pm(2^3-2^0)$, $\pm(2^2+2^0)$, $\pm(2^1-2^0)$.

The bit S2 located at the head of bits representing output data of the converting logic circuit 23c is equal to the sign bit S of the adding output data, and indicates a sign of a value represented by the exponent of "2". The bit S3 located at the tail end of the bits is equal to zero if the sign of a value in a bracket is the same as the sign in front of the bracket, and is equal to one if those signs differ from each other. In cases where the adding output data is ±9, ±5 and ±3, the bit S2 is zero, and in cases where the adding output data is ±7 and ±1, the bit S2 is one. In addition, in a case the adding output data is +9, the bit S3 is zero, and in a case where the adding output data is −9, the bit S3 is one. The two bits B1 and B2 indicates a pair of two numbers each of which is represented by the exponent of "2". That is, a pair $(2^3, 2^0)$ is indicated by bits (1,1), a pair $(2^2, 2^0)$ is indicated by bits (1,0), a pair $(2^1, 2^0)$ is indicated by bits (0,1). Thus, the converting logic circuit 23c can be formed of a simple logic structure. In the multiplying operation in which a coefficient is multiplied by the output data of the converting logic circuit 23, the multiplying result is obtained by shifting the coefficient by a number represented by the two bits B1 and B2. The second term in each parentheses is always $2^0$ and the number of shifting bits corresponding to $2^0$ is zero.

For example, in a case where the adding output data of the four bit adder 23b is +7 (="00111"), +7 is represented by $+(2^3-2^0)$ and the converting logic circuit 23c converts S, a3, a2, a1, a0="00111" } into S2, B1, B2, S3="0111". In this case, the two bits B1 and B2 are equal to "11". Thus, in the first multiplying operation in which the first term $2^3$ in the parentheses is multiplied by the coefficient, the coefficient is shifted by 3 bits which is the number represented by "11" (B1, B2), so that a first multiplying result is obtained. In the second multiplying operation in which the second term $2^0$ in the parentheses is multiplied by the coefficient, the coefficient is not shifted, so that the coefficient itself is obtained as a second multiplying result. The first multiplying result and the second multiplying result having the sign (−) are added to each other, so that the final multiplying result is obtained. In a case where the adding output data of the four bit adder 23b is −5 (="11011"), −5 is represented by $-(2^2+2^0)$, and the converting logic circuit 23c converts S, a3, a2, a1, a0="11011" into S2, B1, B2, S3="1101". In this case the two bits B1 nd B2 equal to "10" indicates a 2-bit shifting operation. Thus, in the multiplying operation, the coefficient shifted by 2 bits and the coefficient which is not shifted are added to each other, and the sign (−) is added to the adding result, so that the final multiplying result is obtained.

Figure 12:
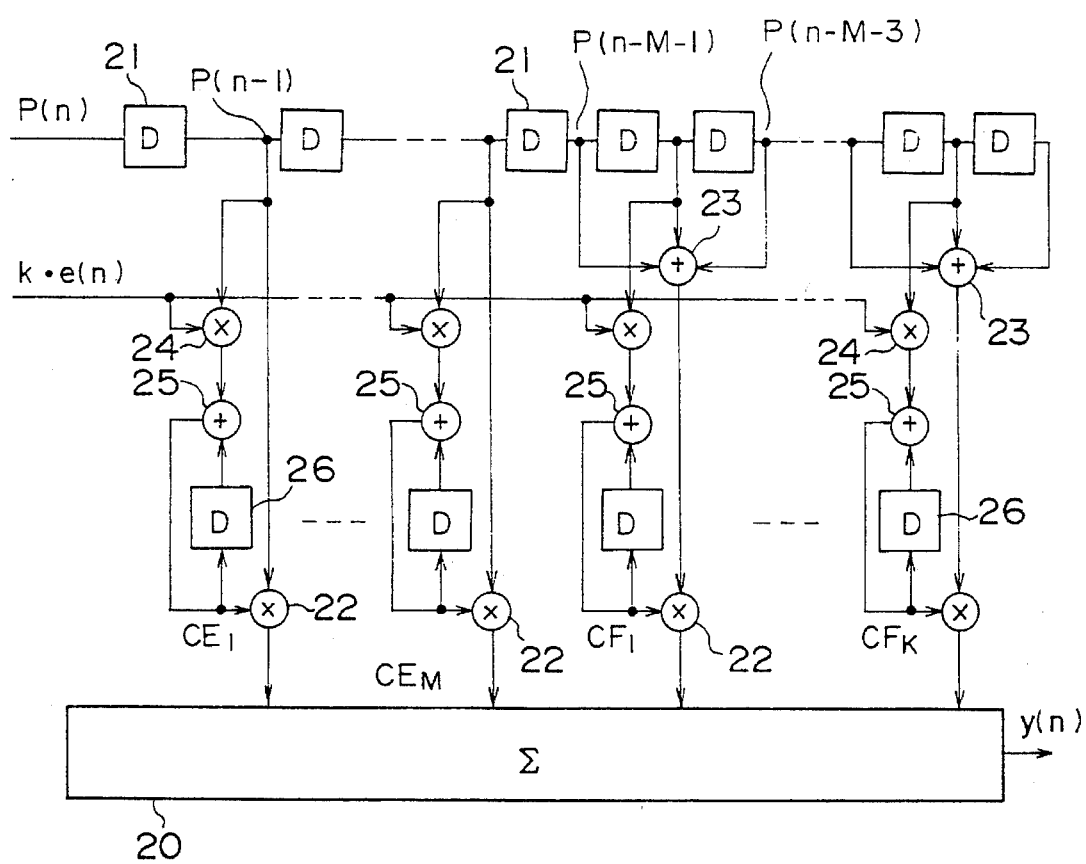
FIG. 12 is a diagram illustrating an essential part of a transversal filter provided in the digital subscriber loop interface unit according to a second embodiment of the present invention.

A description will now be given, with reference to FIG. 12, of a second embodiment of the present invention. In FIG. 12, those parts which are the same as those shown in FIG. 10 are given the same reference numbers. Referring to FIG. 12, there are further provided multipliers 24 (×), adders 25 (+) and delay elements 26 (D). In this embodiment, a structure for updating the tap coefficients is added to the structure shown in FIG. 10. The update of the tap coefficients is performed by using the multipliers 24, the adders 25 and the delay elements 26. The tap coefficient $CE_i$ is represented by the following equation:

$$CE_i(n+1)=CE_i(n)+k\cdot e(n)\cdot P(n-i) \qquad (8)$$

where i=1−M, k is a step size and e(n) is an error signal based on updating coefficients. If k·e(n) which is a product of the error signal e(n) and the step size has been previously calculated, since the equation (8) corresponds to a product-sum operation (A×(symbol)+C→D), the operation in accordance with the equation (8) can be carried out in a one machine cycle by using a 3-input adder.

Figure 1:
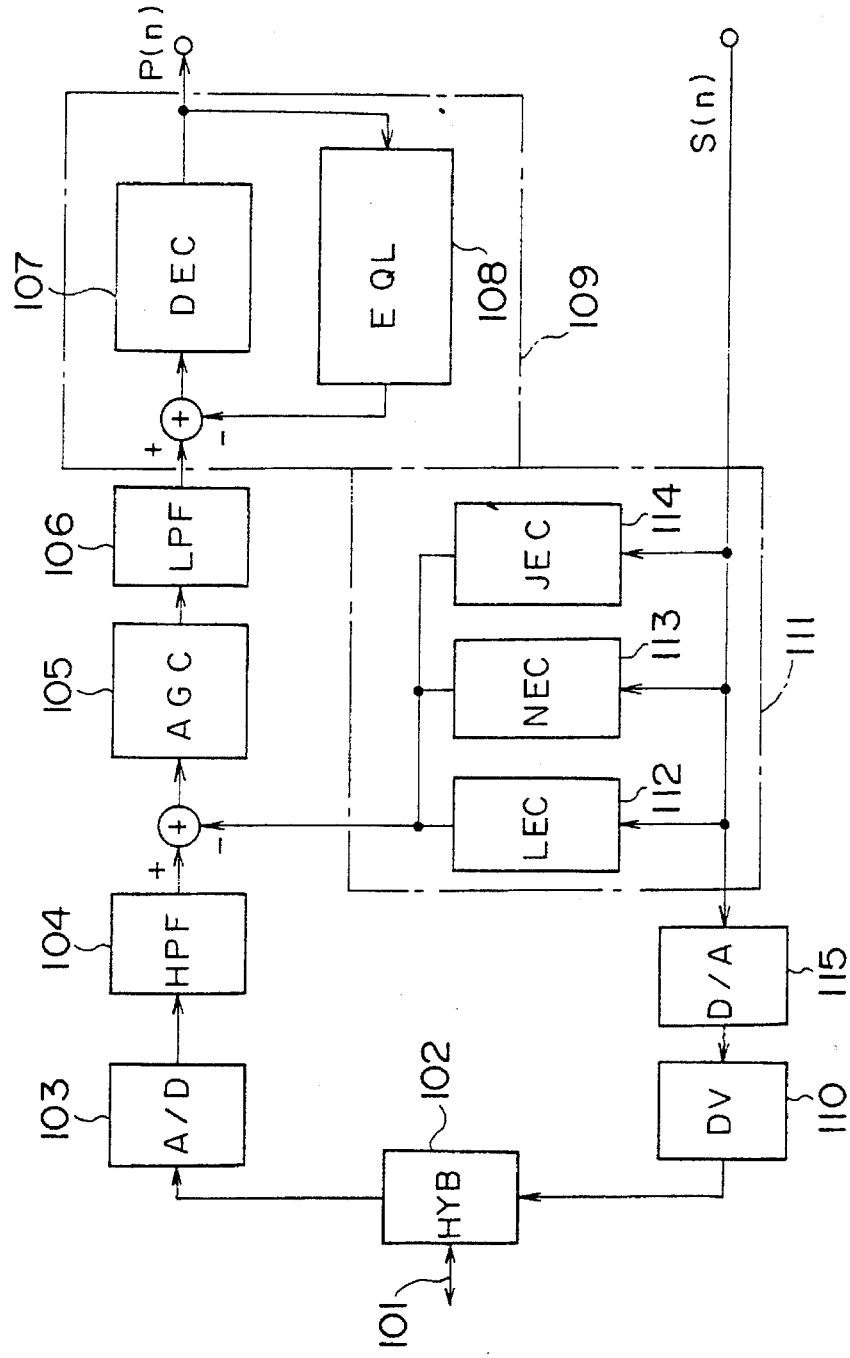
FIG. 1 is a block diagram illustrating an example of a conventional digital subscriber loop unit.
Figure 2:
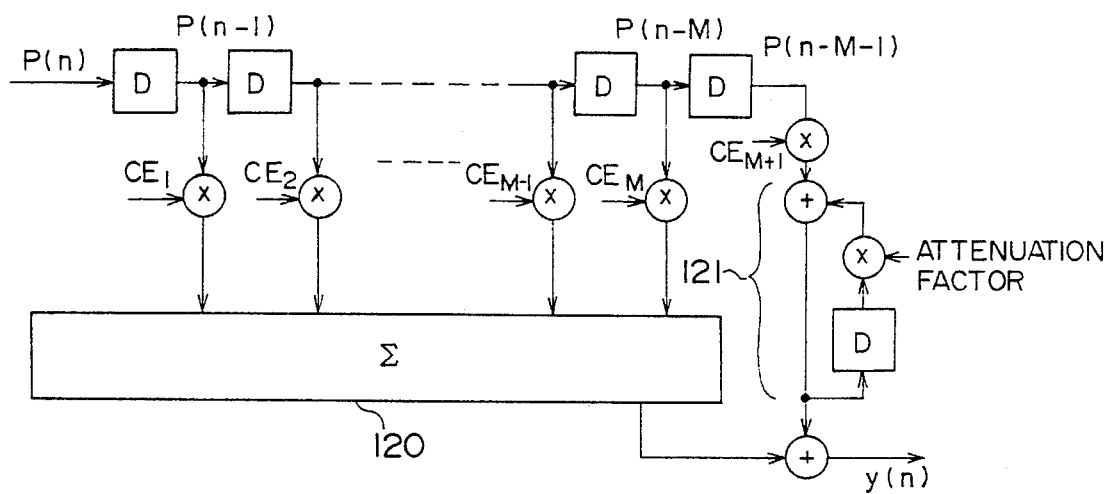
FIG. 2 is a diagram illustrating an essential part of a conventional transversal filter.
Figure 3:
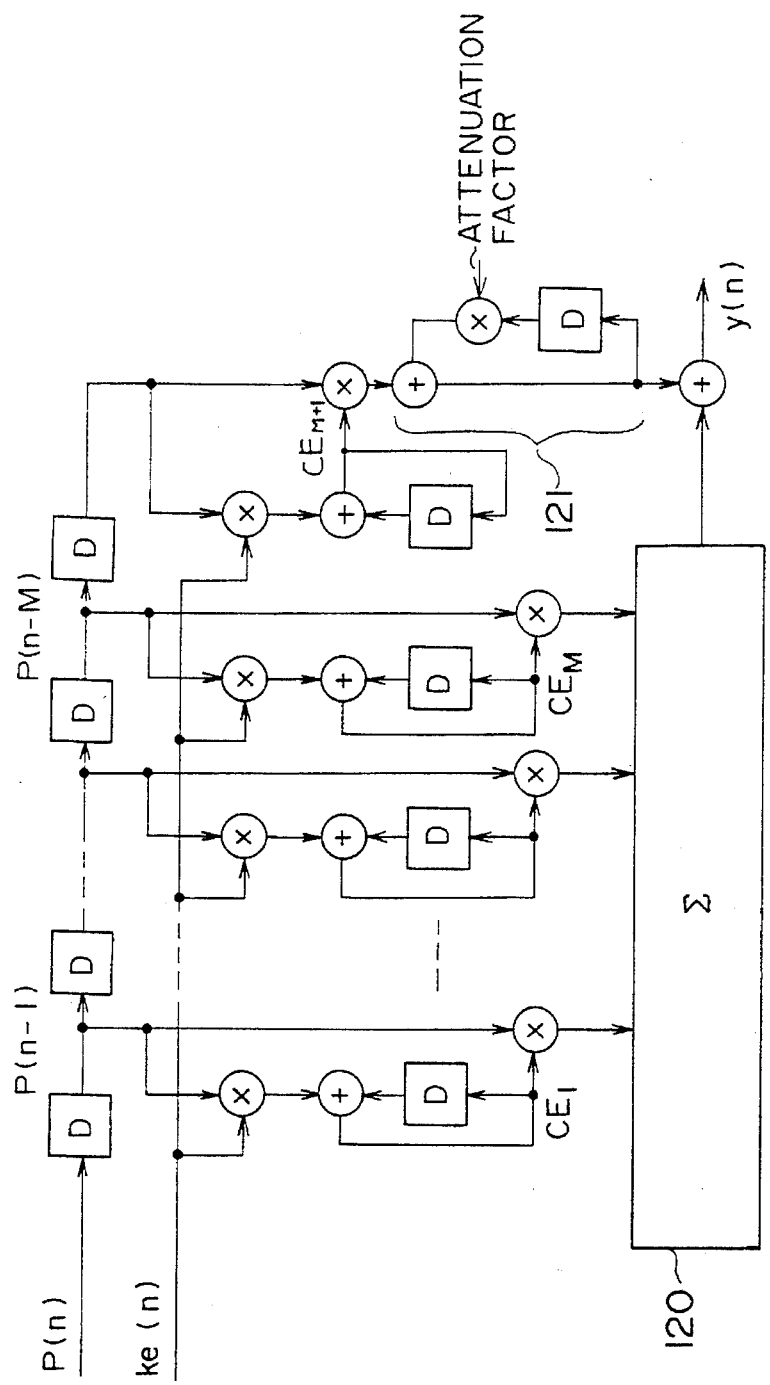
FIG. 3 is a diagram illustrating a conventional transversal filter having an updating circuit for tap coefficients.
Figure 4:
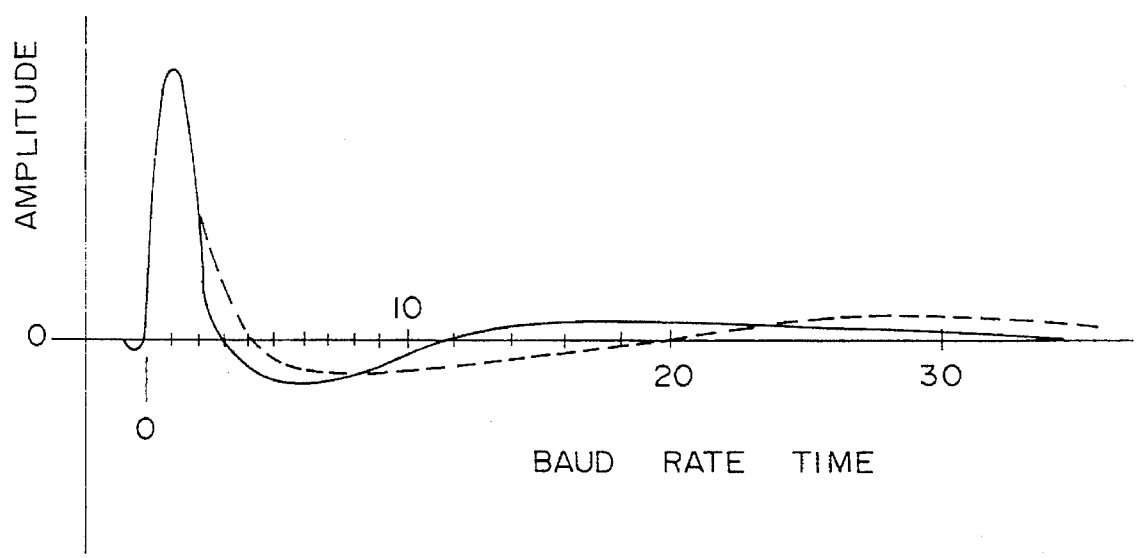
FIG. 4 is a wave form diagram illustrating an impulse response of a received signal.
Figure 5:
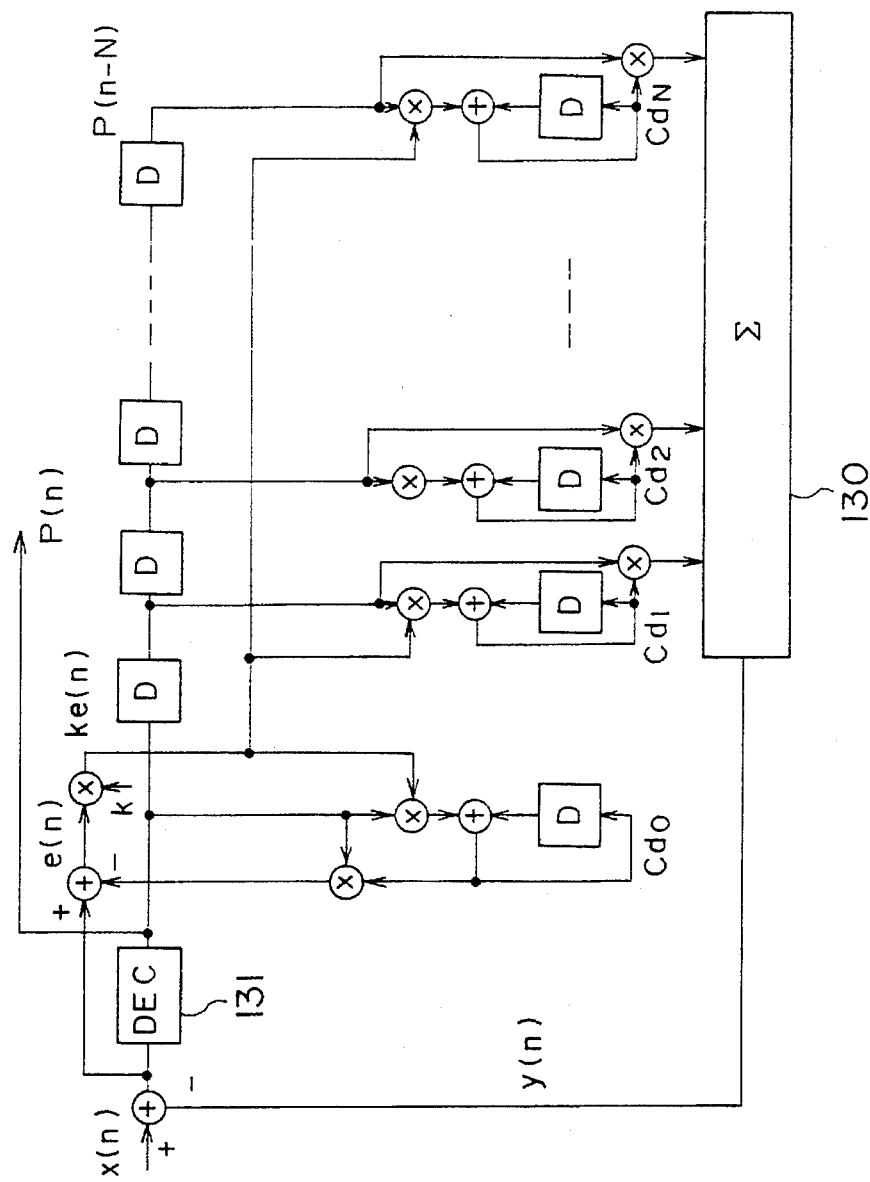
FIG. 5 is a diagram illustrating an essential part of a conventional decision feedback equalizer.
Figure 6:
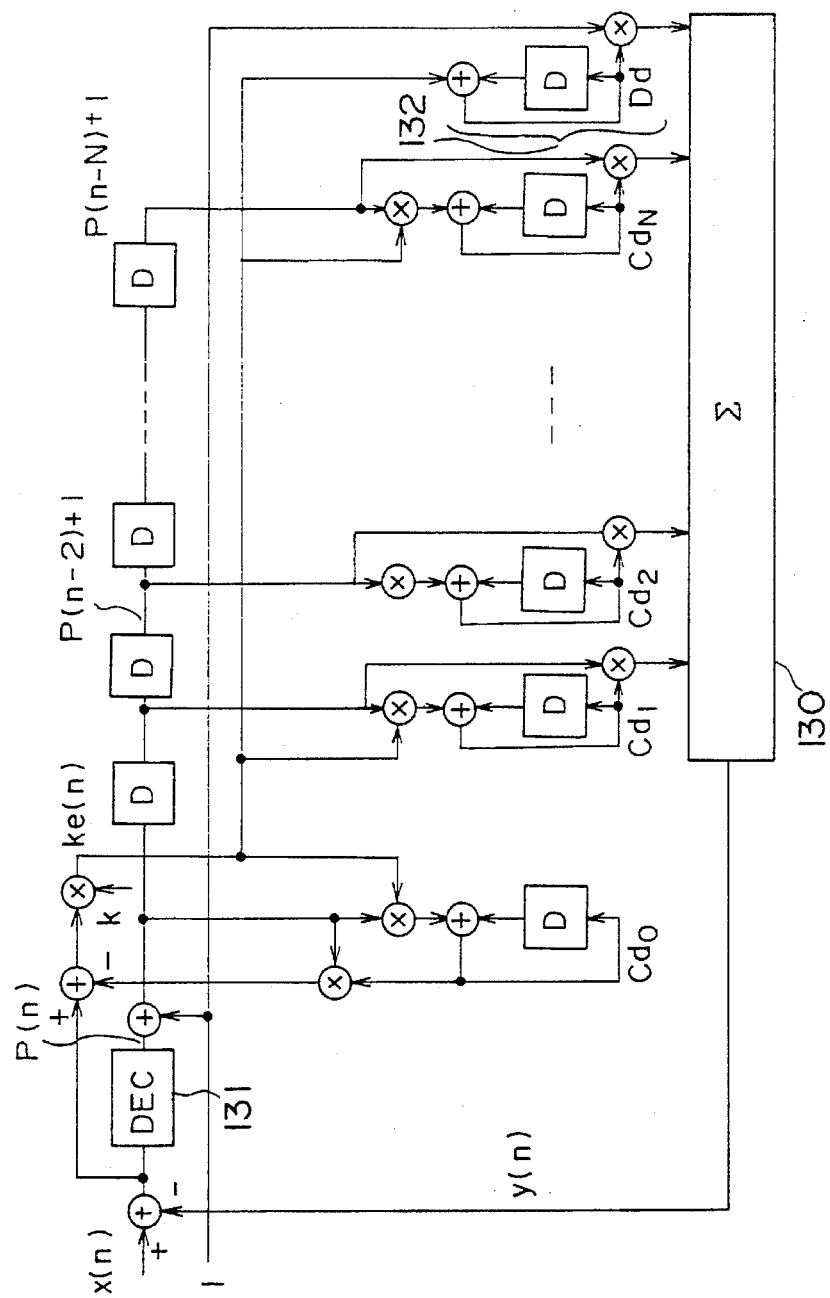
FIG. 6 is a diagram illustrating an essential part of a conventional decision feedback to which the "symbol value +1" is applied.
Figure 7:
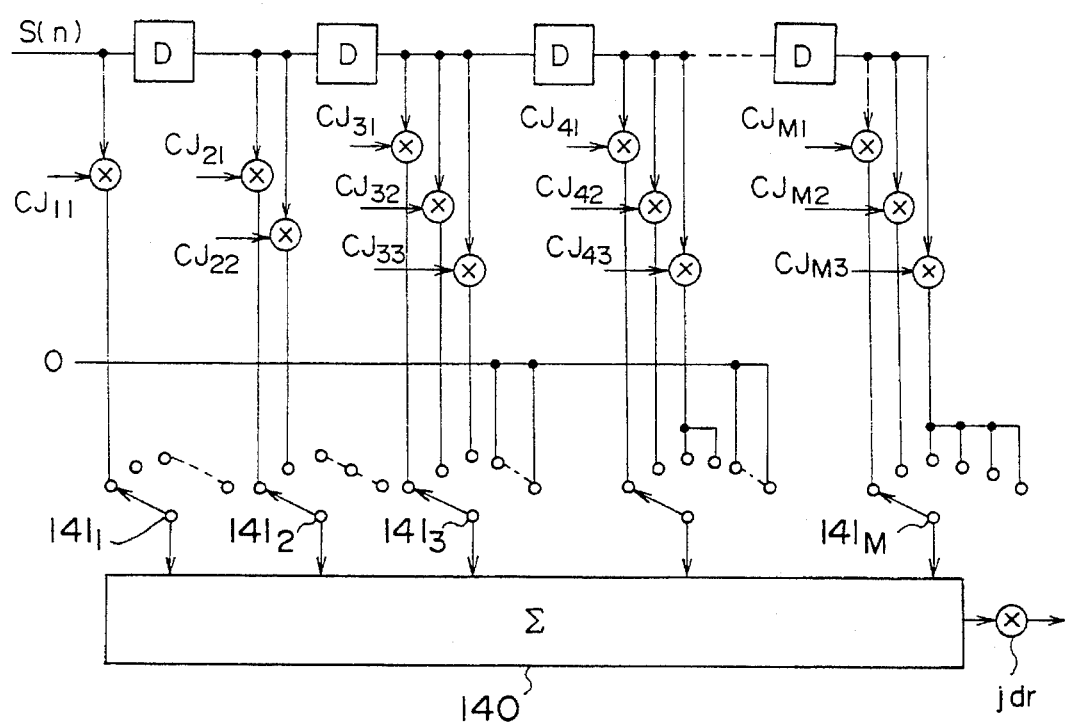
FIG. 7 is a diagram illustrating a conventional jitter echo canceler.

The updating operation for the tap coefficient $CF_j$ can be carried out by using one of the L symbols. In a case shown in FIG. 3, L is equal to 3 (L=3) and a second symbol among the three symbols is used in the updating operation. If a first symbol is represented by P(n−M−1), the second symbol is represented by P(n−M−2). In this case, the tap coefficient $CF_j$ is updated by using the second symbol P(n−M−2). Thus, the tap coefficient $CF_j$ is updated in accordance with the following equation:

$$CF_j(n+1)=CF_j(n)+k\cdot e(n)\cdot P(n-M-3j+1) \qquad (9)$$

where j=1−K. The equation (9) has the same structure as the equation (8), so that even if the same tap coefficient $CF_j$ is assigned to the L taps, the updating operation for the coefficient $CF_j$ can be carried out in one machine cycle.

Figure 13:
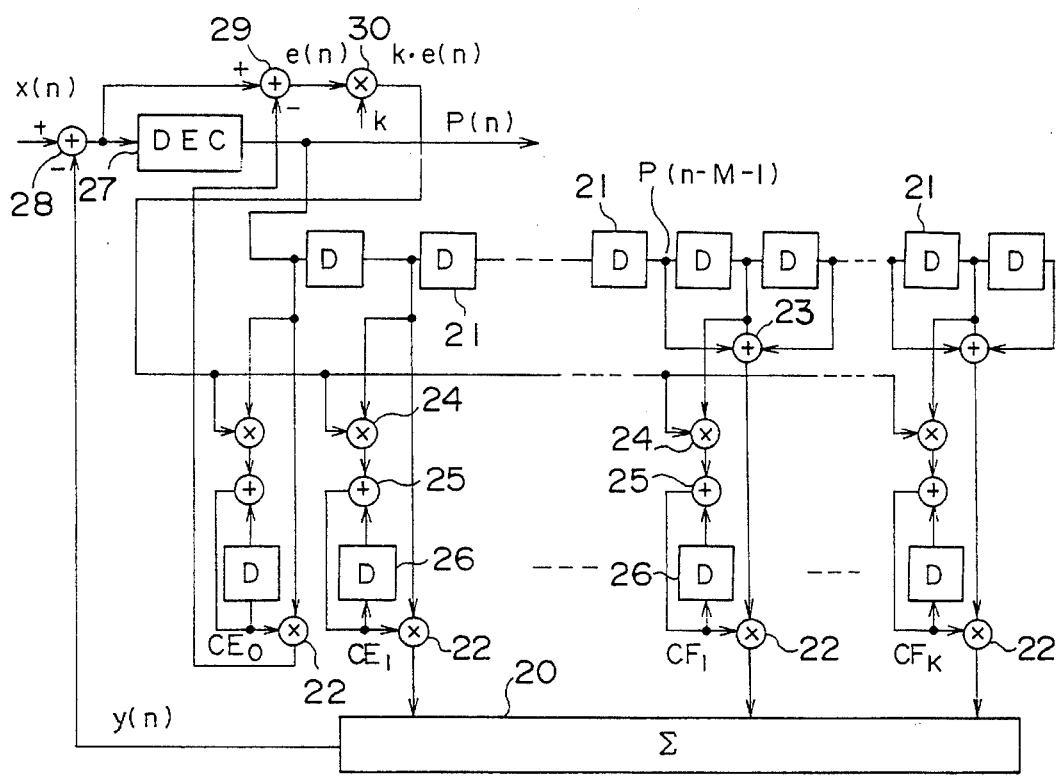
FIG. 13 is a diagram illustrating an essential part of a decision feedback equalizer provided in the digital subscriber loop interface unit according to a third embodiment of the present invention.

A description will now be given, with reference to FIG. 13, of a third embodiment of the present invention. In FIG. 13, those parts which are the same as those shown in FIG. 12 are given the same reference numbers. Referring to FIG. 13, there are further provided a discriminator 27, adders 28 and 29 and a multiplier 30. This embodiment relates to the decision feedback equalizer 3 shown in FIG. 9. Thus, the input x(n) is a signal from which the echo components are eliminated by the echo canceler 1. The input x(n) and the output signal y(n) of this transversal filter are supplied to the adder 28 so that the difference between them is obtained. The difference value is supplied to the discriminator 27 and a discriminated symbol P(n) is output from the discriminator 27.

A circuit into which the circuit shown in FIG. 11, a shifter and an adder are assembled can be substituted for a process corresponding to the adder 23 and a process corresponding to the multiplier 22.

The estimation of the S/N ratio was carried out using the echo canceler 1 having a transversal filter in which M=18, L=3 and K=4 and the decision feedback equalizer 3 having a transversal filter in which M=16, L=3 and K=4. The following results were obtained.

In a case where the inductance of the hybrid transformer was 80 mH, the S/N of 22.82 dB was obtained.

In a case where the inductance of the hybrid transformer was 15 mH, the S/N of 22.35 dB was obtained. In this case, both the echo canceler 1 and the decision type feedback equalizer 3 were not provided with the recursive filter.

To obtain the above S/N ratio in the conventional structure, the transversal filter must have 24 taps and the recursive filter is needed. In this case, in view of the amount of processing, the equivalent number of taps of transversal filter is 26, because the primary recursive filter needs the same amount of processing as the transversal filter having two taps. On the other hand, in the above experiment, the echo canceler has 22 taps, the decision feedback equalizer 3 has 20 taps and the recursive filter is not needed. Thus, the equivalent number of taps of the traversal filter, in view of the amount of processing, can be decreased. That is, the amount of processing can be decreased, so that the dissipation power can be decreased.

Figure 14:
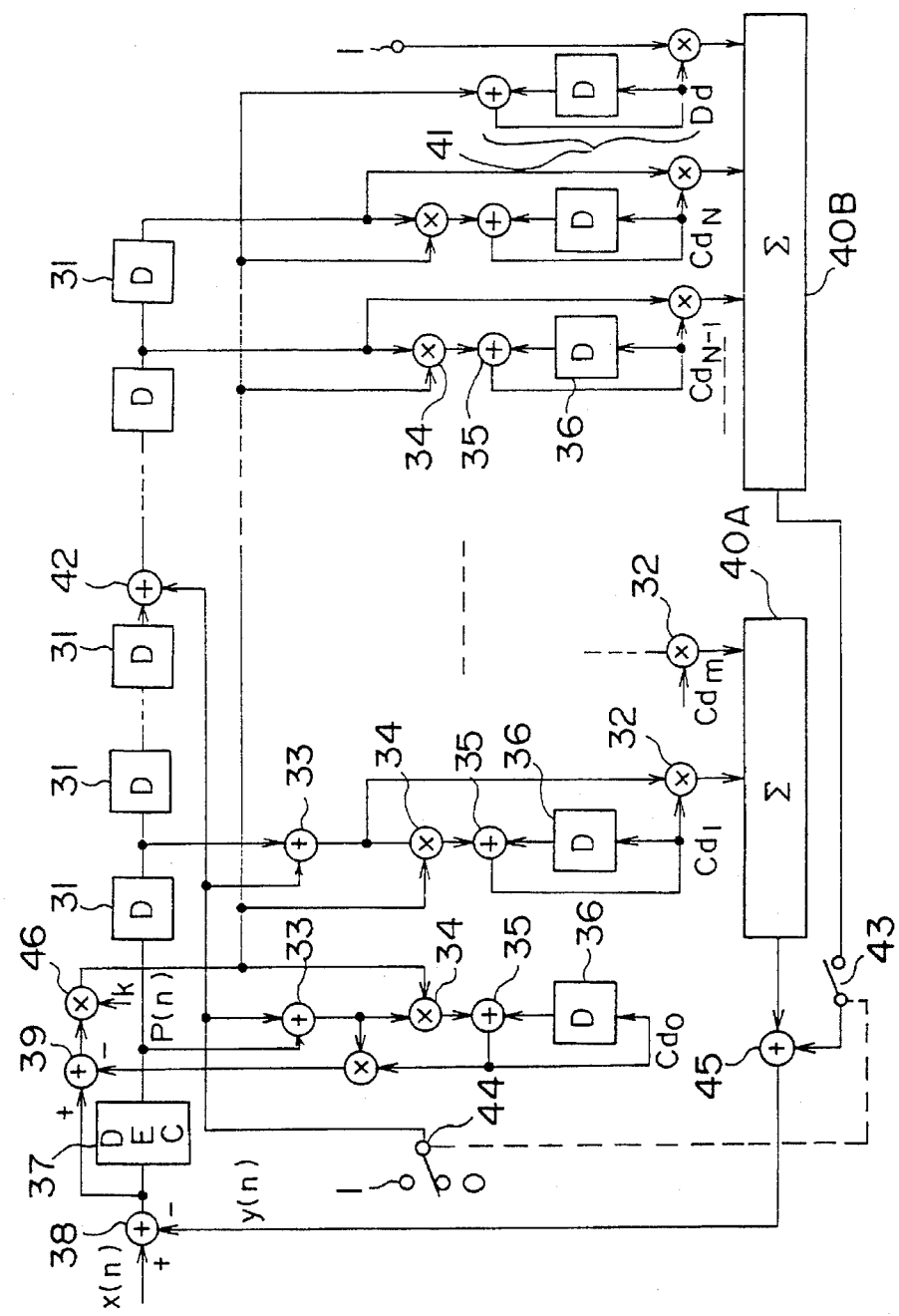
FIG. 14 is a diagram illustrating an essential part of a decision feedback equalizer provided in the digital subscriber loop interface unit according to a fourth embodiment of the present invention.

A description will be given, with reference to FIG. 14, of a fourth embodiment of the present invention. This embodiment relates to the decision feedback equalizer 3 shown in FIG. 9. The echo canceler 1 uses a value represented by adding +1 to a symbol value. The decision feedback equalizer 3 decreases the number of taps in the pull-in step and uses a symbol value as it is. After the pull-in step, the decision feedback equalizer 3 increases the number of taps and uses a value represented by adding +1 to a symbol value. Referring to FIG. 14, there are provided delay elements 31 and 36, a discriminator 37 (DEC), adders 40A and 40B ($\Sigma$), a DC correction part 41, switches 43 and 44, multipliers 32, 34 and 46 ($\times$) and adders 33, 35, 38, 39, 42 and 45 (+). Tap coefficients $Cd_0$–$Cd_N$ and Dd are supplied to the transversal filter shown in FIG. 14.

An adder in the transversal filter is divided into the adders 40A and 40B. The number of taps coupled to the adder 40A is equal to or less than a number a half as many as the total number (N) of taps, and the number of taps coupled to the adder 40B is N−m+1 including that of the DC correction part 41. The switches 43 and 44 is in the state shown in FIG. 14 in the pull-in step, and after the pull-in step, the switch 44 is switched from "0" to "1" and the switch 43 is turned on.

The output signal x(n) from the low pass filer 9 (see FIG. 9) is supplied to the adder 38 of the decision feedback equalizer 3, and the difference between the signal x(n) and the output signal y(n) of the transversal signal is obtained. The difference is supplied to the discriminator 37 and the symbol P(n) is output from the discriminator 37 as a discriminated output signal.

In the pull-in step, the switch 43 is in the off state as shown in FIG. 14, so that the adder 40B is not operated. Thus, a part including the adder 40A carries out the updating process and convolution process regarding the tap coefficients $Cd_0$–$Cd_m$ for taps extending to the m-th tap. That is, the processes are carried out the following equations:

$$Cd_j(n+1)=Cd_j(n)+k \cdot e(n) \cdot P(n-j) \tag{10}$$

where j=0, 1, 2, . . . , m, and $$y(n)=\Sigma^m_{j=1}[Cd_j \cdot P(n-j)] \tag{11}$$

where $\Sigma^m_{j=1}$ means adding operations while j is varying from 1 to m, k is a step size, e(n) is an error signal and P(n−j) is an output symbol at a time (n−j). The error signal e(n) output from the adder 39 is obtained by the following equation:

$$e(n)=x(n)-y(n)-Cd_0 \cdot P(n). \tag{12}$$

The error signal e(n) is multiplied by the step size k in the multiplier 46.

The symbol P(n−j) has one of values±3 and ±1. In a case where the symbol has +3 or −3, the number of times of operations using a 2-input adder differs from the number of times of operations using a 3-input adder. In a case using the 2-input adder, the number of times of operations in accordance with the above equation (10) is 2m+2, the number of times of operations in accordance with the above equation (11) is 2m−1 and the number of times of operations in accordance with the above equation (12) is 3. As a result, the total number of times of operations is 4m+4. On the other hand, in a case using the 3-input adder, the number of times of operations in accordance with the above equation (10) is m+1, the number of times of operations in accordance with the above equation (11) is m−1 and the number of times of operations in accordance with the above equation (12) is 2. As a result, the total number of times of operations is 2m+2. As to the operation for k·e(n), since the step size k is represented by the exponent of "2", the operation can be performed by shifting the error signal e(n). Thus, the number of times of this operation is zero.

After the pull-in step in the decision feedback equalizer 3, the switch 43 is turned on and the switch 44 is switched from "0" to "1". As a result, the tap coefficient and other signals are obtained in accordance with the following equations.

$$Cd_j(n+1)=Cd_j(n)+k \cdot e(n) \cdot [P(n-j)+1] \tag{13}$$

$$Dd(n+1)=Dd(n)+k \cdot e(n) \tag{14}$$

$$y(n)=\Sigma^N_{j=1}[Cd_j \cdot \{P(n-j)+1\}]+Dd \tag{15}$$

$$e(n)=x(n)-y(n)-Cd_0[P(n)+1] \tag{16}$$

In this case, the symbol P(n−j)+1 and P(n)+1 means that +1 is added to ±3 and ±1, so that symbol P(n−j)+1 and P(n)+1 have one of values 4, 2, 0, and −2. Thus, in a case where the 2-input adder and a shifter are used, the number of times of operations in accordance with the equations (13) and (14) is N+2, the number of times of operations in accordance with the equation (15) is N and the number of times of operations in accordance with the equation (16) is 2. As a result, the total number of times of operations is 2N+4. Thus, in a case where (4m+4)≦(2N+4), that is, m<N/2, even if a symbol value is used in the pull-in step and a value represented by adding +1 to a symbol value is used after the pull-in step, the number of times of operation is not increased after the pull-in step.

In the above embodiment, to obtain the symbol P(n−j)+1 or P(n−j), "1" or "0" is supplied to the adder 42 via the switch 44. However, an operation in which +1 is added to a symbol and an operation in which the symbol outputs without adding +1 may be switched by a parameter control.

Figure 15:
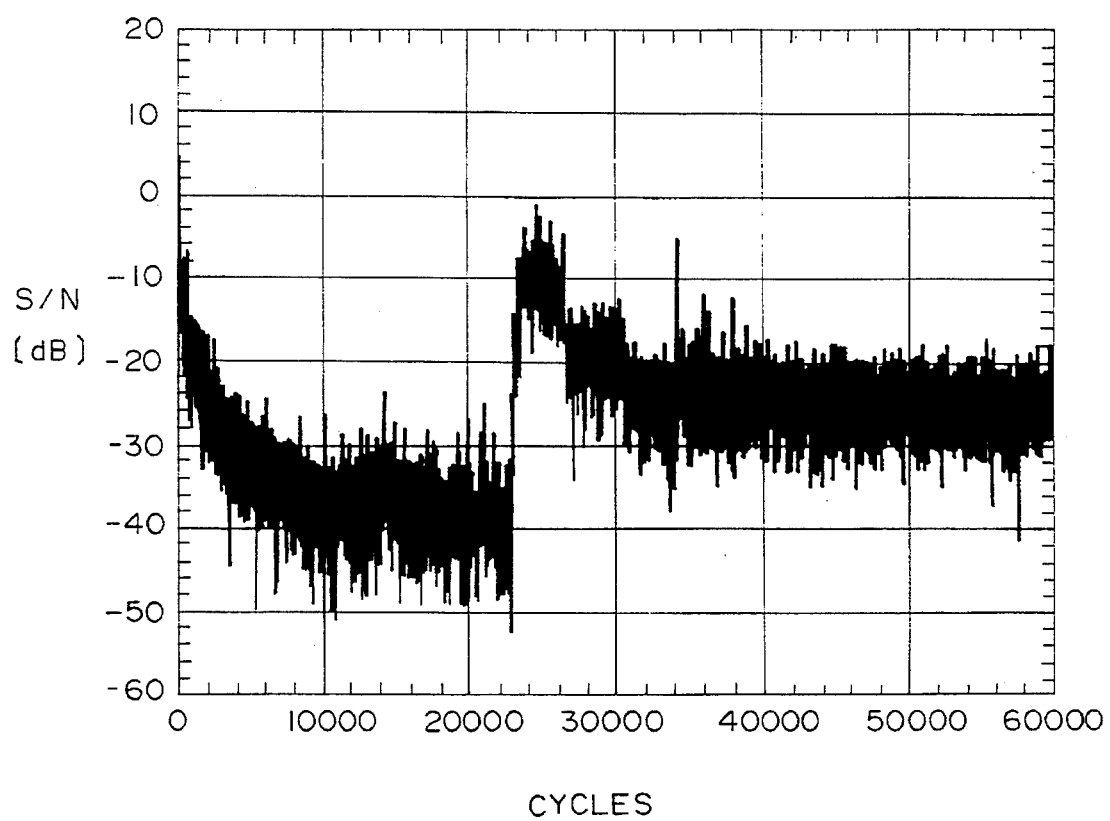
FIG. 15 is a diagram illustrating an S/N characteristic of a pull-in process carried out in the decision feedback equalizer according to the fourth embodiment.

An S/N characteristic and a phase characteristic in the pull-in step in the fourth embodiment described above are respectively shown in FIGS. 15 and 16. The S/N characteristic and the phase characteristic were obtained as the results of simulation in the digital subscriber loop interface unit at the subscriber side. In FIG. 15, the axis of ordinates indicates the S/N ratio [dB], in FIG. 16, the axis of ordinates indicates the phase [degree], and in respective FIGS. 15 and 16, the axis of abscissas indicates the number of cycles from starting the pull-in step. In this case, the number of taps was eight in the pull-in step, and the number of taps was twenty four after the pull-in step.

In a range between 0 and 23,000 cycles, the pull-in step in the echo canceler was performed. In a range between 23,000 cycles and 30,500 cycles, the updating operation of the tap coefficients of the echo canceler was stopped and the pull-in step in the decision feedback equalizer was performed. In this case, the number of taps in the decision feedback equalizer 3 was eight and the updating operation of the tap coefficients and the convolution operation were carried out by using symbols having values ±3 and ±1 represented by the 2B1Q codes. After this, the number of taps was changed to twenty four and the updating operation of the tap coefficients and the convolution operation were carried out by using a value represented by adding +1 to a symbol value. In a range in which the number of cycles exceeds 35,000, the updating operation of the echo canceler taps is performed.

Figure 16:
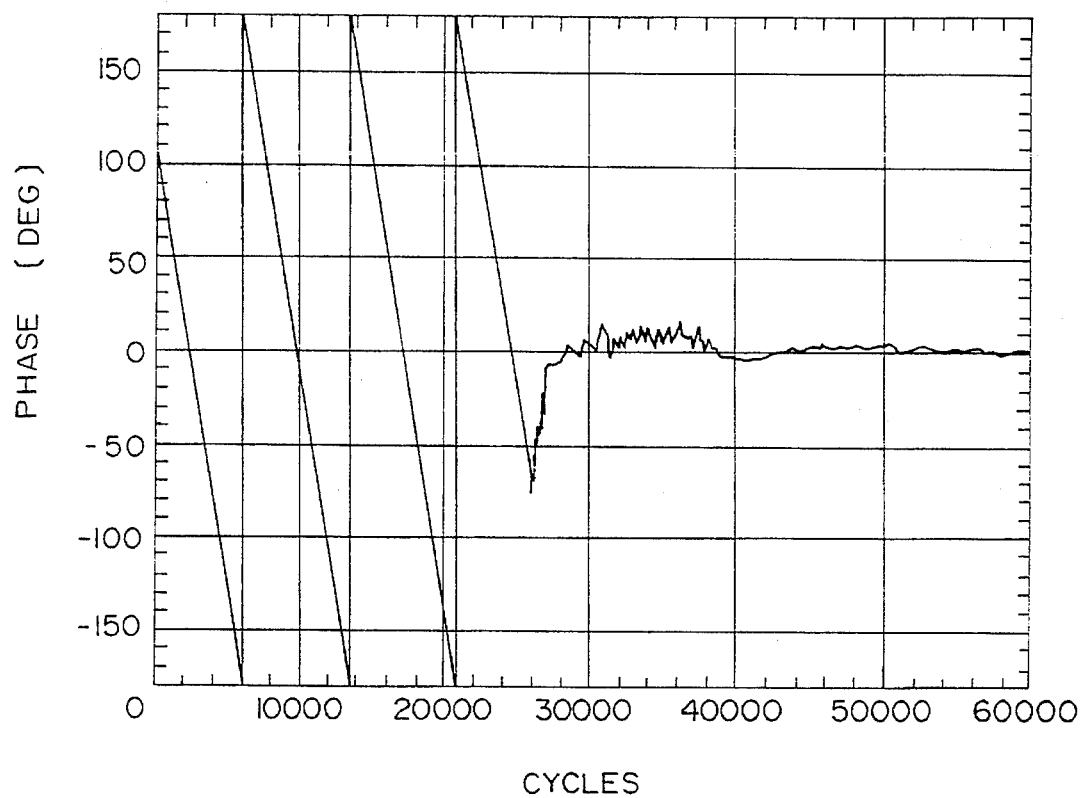
FIG. 16 is a diagram illustrating a sampling phase characteristic of the pull-in process carried out in the decision feedback equalizer according to the fourth embodiment.

When the pull-in step was carried out under a condition in which the number of taps in the decision feedback equalizer 3 was eight, as shown in FIG. 16, although the residual was sightly large, a phase was pulled in the suitable sampling phase. After this, the phase was stably maintained at the sampling phase. That is, in a case where a value obtained by adding +1 to a symbol value was used, a problem in that it is difficult for the decision feedback equalizer to accomplish the pull-in of the phase was solved without increasing the amount of processing.

It may be determined that the pull-in has been completed when a predetermined number of pull-in steps has been performed, that is, a predetermined time has elapsed, after the first pull-in step starts, as shown in FIGS. 15 and 16. If it is determined that the pull-in has been completed, the process using a symbol value is changed to the process using a value represented by adding +1 to a symbol value. The above predetermined time may be set at a long time sufficient to complete the pull-in in any case.

It may be also determined that the pull-in has been completed when the sampling phase is approximately constant.

Figure 17:
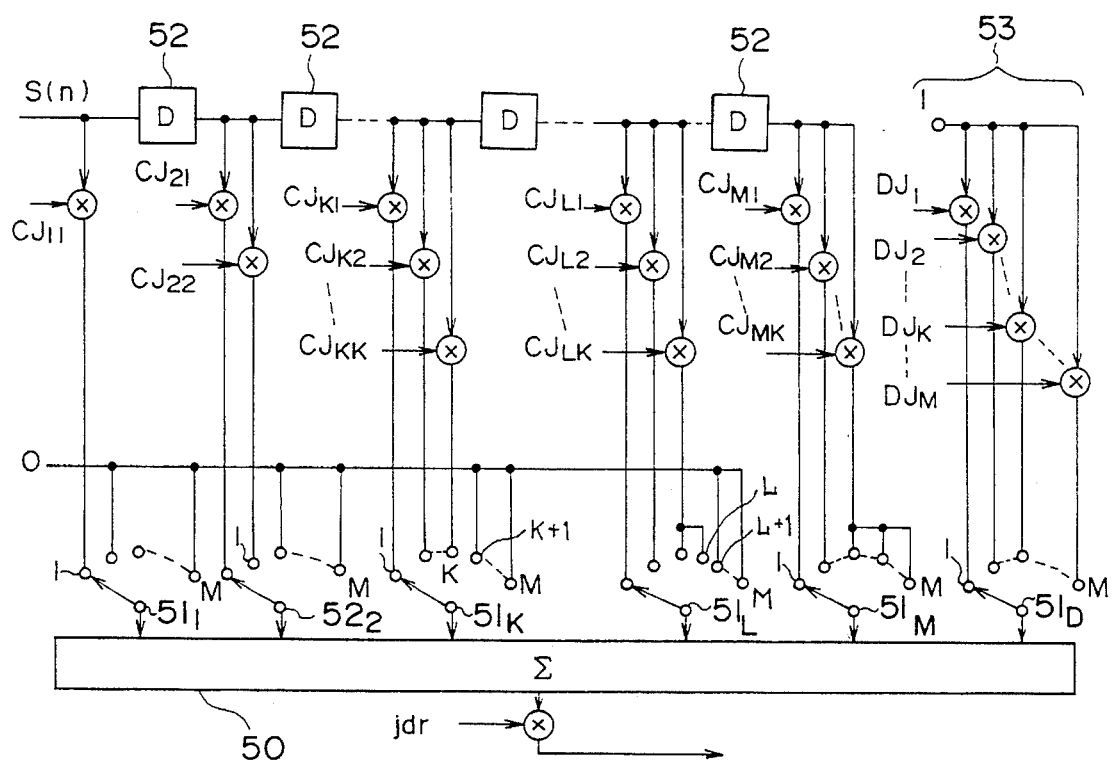
FIG. 17 is a diagram illustrating an essential part of a jitter echo canceler provided in the digital subscriber loop interface unit.

A description will now be given, with reference to FIG. 17, of a fifth embodiment of the present invention. The echo canceler 1 shown in FIG. 9 is formed, as described above, of the linear echo canceler, the non-linear echo canceler and the jitter echo canceler. This embodiment relates to the jitter echo canceler in which a value obtained by adding +1 to a symbol value is used. Referring to FIG. 17, there are provided an adder 50 ($\Sigma$), switches $51_1$–$51_M$ and $51_D$, delay elements 52 and a DC correction part 53. The jitter echo canceler also has multipliers ($\times$), and tap coefficients $CJ_{11}$–$CJ_{MK}$ and tap coefficients $DJ_1$–$DJ_M$ for the DC correction part 52 are supplied to the multipliers ($\times$).

In a case where a value obtained by adding +1 to a symbol value is used, in the jitter echo canceler, a range in which the convolution operation is carried out is varied in accordance with a time elapsing from a time when the jitter has occurred, so that the sum of the tap coefficients are also varied. Thus, the tap coefficients for the DC correction part 52 must be varied. In this embodiment, the number of tap coefficients $DJ_1$–$DJ_M$ used for the DC correction part 52 is equal to the number M of cycles in which the jitter echo canceler is operated.

The number of cycles from a time when the jitter has occurred is represented by I. At a cycle I=1, the switches $51_1$–$51_M$ and $51_D$ are in the sate shown in FIG. 17. Thus, the tap coefficients $CJ_{11}$–$CJ_{M1}$ and the tap coefficient $DJ_1$ for the DC correction part 52 are selected. At a cycle I=2, the switches $51_1$–$51_M$ and $51_D$ are switched from the above first contact to a second contact from the left. As a result, "0" is selected by the switch $51_1$, and the tap coefficients $CJ_{22}$–$CJ_{M2}$ and the tap coefficient $DJ_2$ for the DC correction part 52 are respectively selected by the switches $51_2$–$51_M$ and the switch $51_D$. At a cycle I=K, "0" is selected by the switches $51_1$–$51_{K-1}$, the tap coefficients $CJ_{KK}$–$CJ_{MK}$ are selected by the switches $51_K$–$51_M$, and the coefficient $DJ_K$ is selected by the switch $51_D$.

At a cycle I=L (M<L<K), "0" is selected by the switches $51_1$–$51_{L-1}$, the tap coefficients $CJ_{LK}$–$CJ_{MK}$ are selected by the switches $51_L$–$51_M$, and the tap coefficient $DJ_L$ is selected by the switch $51_D$. At a cycle I=M, "0" is selected by the switches $51_1$–$51_{M-1}$, the tap coefficient $CJ_{MK}$ is selected by the switch $51_M$, and the tap coefficient $DJ_M$ is selected by the switch $51_D$.

Thus, the convolution operation is carried out in accordance with the following equation:

$$y(I) = [\Sigma^M_{j=I} \{CJ_{Ij} \cdot [S(I-j)+1]\} - DJ_I] \cdot jdr \qquad (17)$$

where $\Sigma^M_{j=I}$ represents continuous adding operations from j=I to j=M, I=1, 2, . . . , M and jdr is "1" or "−1". Y(I) is infinitesimal at I=1, so that a number I may be varied from 2 to M (I=2, 3, . . . , M). S (I−j) represents a transmission signal as a function of the number I of the cycles from at a time when the jitter has occurred, and S(1) represents the transmission signal immediately after the jitter has occurred.

The tap coefficient $CJ_{Ij}$ is updated in accordance with the following equation.

$$CJ_{Ij}(I+1) = CJ_{Ij}(I) + k \cdot e(I)[S(I-j)]+1] \cdot jdr \qquad (18)$$

The tap coefficients $DJ_1$–$DJ_M$ is updated in accordance with the following equation.

$$DJ_I(I+1) = DJ_I(I) + k \cdot e(I) \cdot jdr \qquad (19)$$

The coefficients of the conventional jitter echo canceler are stored in a memory, and the coefficients are read out from the memory every time the operation for each taps is carried out. The convolution operation is performed by using the coefficients, and the coefficients are then updated. In this embodiment, the various operations may be carried out in almost the same manner as in the conventional jitter echo canceler. In this case, a memory is needed to store the coefficients for the DC correction part 53. However, the capacity of this memory can be decreased as will described below.

That is, comparing the equations (3) and (17) to each other, the following equation stands.

$$DJ_I = \Sigma^M_{j=I} CJ_{Ij} \qquad (20)$$

This equation (20) means that the DC correction part corresponds to the total sum of tap coefficients of the jitter echo canceler.

Thus, in a case where the total sum of tap coefficients in a range in which the convolution operation is carried out in the echo canceler is not large, the tap coefficients for the DC correction part is not large. At a cycle immediately after the jitter echo canceler starts the operation, the adding operation are continuously carried out from a cycle I=1 immediately after the jitter has occurred to a cycle I=M in which the jitter does not almost affect the characteristics of the jitter echo canceler. Thus, the tap coefficient for the DC correction part may be small, and even if the tap coefficient for the DC correction part is equal to "0", this does not almost affect the characteristics of the jitter echo canceler.

In a few cycles before the jitter echo canceler stops the operation, the tap coefficients are small and the number of adding operations is also small. Thus, even if the tap coefficient for the DC correction part is zero, the influence of this on the characteristics of the jitter echo canceler is little. Thus, although the tap coefficient for the DC correction part is to be changed in accordance with the time elapsing, there are cases where the tap coefficient for the DC correction part may be "0" or a value close to "0". Actually, the capacity of the memory used to store the tap coefficient for the DC correction part may be a half as large as that for the M tap coefficients of the jitter echo canceler.

As has been described above, the tap coefficient for the DC correction part is updated in accordance variation of the range in which the convolution operation is carried out, the variation depending on to the time elapsing from occurrence of the jitter. As a result, in the jitter echo canceler, the operations can be carried out by using a value obtained by adding +1 to a symbol value.

Figure 18:
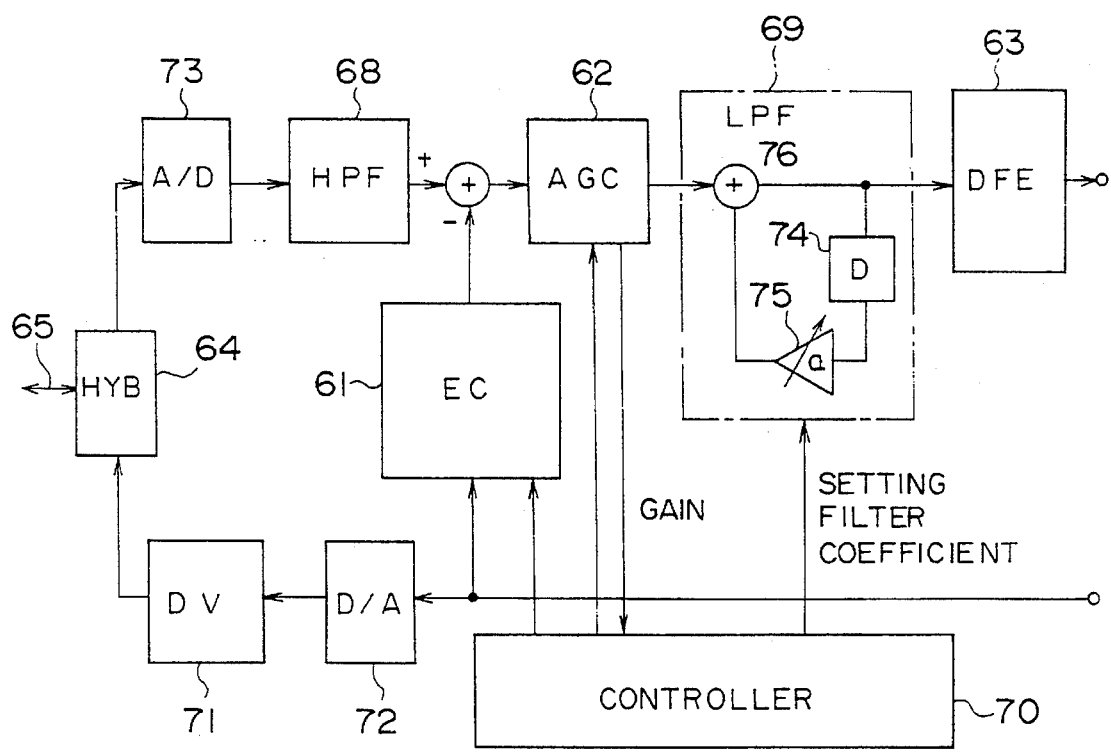
FIG. 18 is a block diagram illustrating a digital subscriber loop interface unit according to a sixth embodiment.

A description will now be given, with reference to FIG. 18, of a sixth embodiment of the present invention. Referring to FIG. 18, a digital subscriber loop interface unit has an echo canceler 61 (EC), an AGC amplifier 62 (AGC), a decision feedback equalizer 63, a hybrid circuit 64 (HYB) connected to a digital subscriber loop 65, a high-pass filter 68 (HPF), a low-pass filter 69 (LPF), a controller 70, a driver 71 (DV), a digital-to-analog converter 72 (D/A) and an analog-to-digital converter 73 (A/D). The low-pass filter 69 is formed of a delay element 74 (D), a factor unit 75 and an adder 76. The echo canceler 61, the decision feedback equalizer 63 and some units have the same structure as those in the previous embodiments, and duplicate description will be omitted.

The low-pass filter 69 formed of the delay element 74, the factor unit 75 and the adder 76 is a primary low-pass filter. A factor a of the factor unit 75 is controlled by the controller 70. The low-pass filter 69 corresponds to the post-cursor equalizer for equalizing the tail portion of the impulse response, as has been described above. The decision feedback equalizer 63 has, for example, 16 taps. Thus, the post-cursor can equalize a portion corresponding to only the 16 taps. In the decision feedback equalizer 63, to discontinue the error decision, the amplitude of the post-cursor should be equal to or less than a value a half as large as the amplitude of the main-cursor.

In view of the above filter coefficients of the low-pass filter 69 are set. The longer the cable, the larger the pulse width of the impulse response. However, in the pull-in step, the main response characteristic is more important than the post-cursor characteristic. Thus, at starting of the pull-in step, the frequency characteristic of the impulse response is controlled so that the pulse width is not large, and after the pull-in step, the frequency characteristic of the impulse response is controlled so that the post-cursor characteristic becomes a required characteristic.

Figure 8:
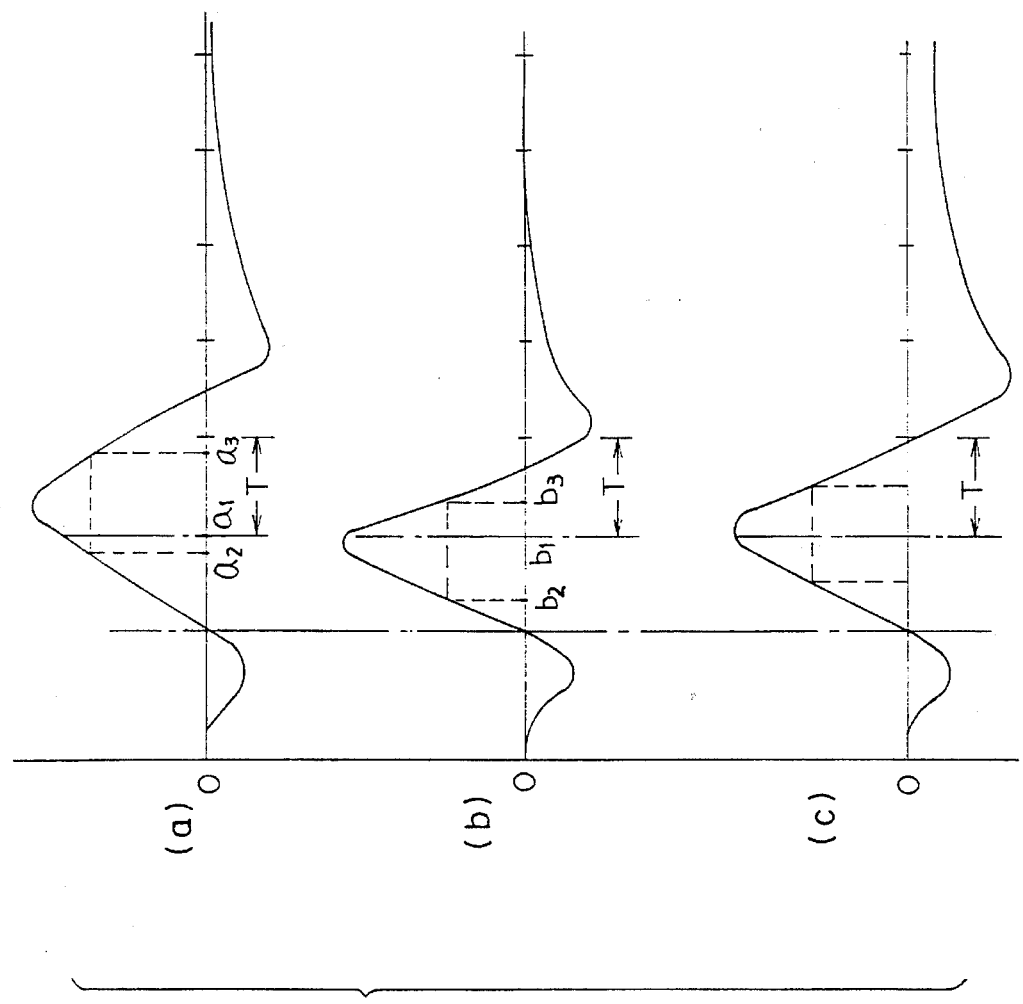
FIG. 8 is a wave form diagram illustrating impulse responses.

Thus, the controller 70 controls the low-pass filter 69 in accordance with the gain information of the AGC amplifier 62 and the sequence from starting of the pull-in step so that the filter coefficient (the factor) a is set at a value corresponding to the length of the cable, and the filter coefficient a is changed from a time at which the pull-in step starts and to a time after the pull-in step. In a case where the cable is long, the impulse response is formed, for example, as shown in FIG. 8(a). In this case, due to selecting the filter coefficient a, the frequency characteristic is controlled so that the pulse width becomes narrow, as shown in FIG. 8(c). As a result, although the post-cursor becomes large to certain extent, the pull-in step can be easily accomplished in the decision feedback equalizer 63. In addition, after the pull-in step, the frequency characteristic is controlled so that the post-cursor has a required size.

In the conventional system, the filter coefficient of the low-pass filter are changed based on the length of the cable. When the length of the cable is maximum, the filter coefficient is set, for example, at "0", and when the length of the cable is minimum, the filter coefficient is set, for example, at "0.75". Furthermore, when the length of the cable is in a range between the maximum value and the minimum value, the coefficient is set, for example, at 0.25 and 0.50 based on the length of the cable. In the this embodiment, the filter coefficient of the low-pass filter is further changed in accordance with a time elapsing from starting the pull-in step, as indicated in the following table.

TABLE

| CABLE LENGTH | PULL-IN START | PROCEEDING TO CONVERGENCE | AFTER-CONVERGENCE |
| --- | --- | --- | --- |
| MINIMUM | 0.75 | 0.75 | 0.75 |
| SHORT | 0.25 | 0.375 | 0.50 |
| LONG | 0.00 | 0.125 | 0.25 |
| MAXIMUM | −0.25 | −0.125 | 0.00 |

When the filter coefficient a is changed as described above, in the decision feedback equalizer 63, the pull-in step is carried out again. In this case, the operation can follow the new filter coefficient within about 5,000 cycles. Thus, due to changing the filter coefficient when the state proceeds to the convergence and after convergence as described above, the excessive time corresponding to about 10,000 cycles is needed in comparison with the conventional system in which the filter coefficient set at start of the pull-in step is fixed. However, this excessive time is sufficiently shorter than the time corresponding to a few hundred thousands cycles needed in the pull-in step. In addition, since the main pulse width of the impulse response can be decreased as shown in FIG. 8(a) and (c), a case where the pull-in step is not accomplished does not occur.

In this embodiment, the low-pass filter 69 is connected to a back end of the AGC amplifier 62. However, since the low-pass filter 69 may be located between the echo canceler 61 and the decision feedback equalizer 63, the low-pass filter 69 may be connected to a front end of the AGC amplifier 62. In addition, the filter coefficient has a value of multiple of 0.125 ($2^{-3}$). Thus, the multiplying operation of the filter coefficient can be carried out by the shifting operation. Further, the number of times the filter coefficient a is changed can be increased.

As has been described above, in the low-pass filter (the post-cursor equalizer) 69 for forming the post-cursor characteristic of the impulse response, the filter coefficient a is set at a value depending on the length of the cable, and is changed in accordance with the time elapsing from starting the pull-in step. Thus, the main pulse width of the impulse response can be decrease in the pull-in step, so that the pull-in step can be easily accomplished.

In the above embodiments, a value obtained adding +1 to a symbol value is used substituting for the symbol value. Further, a value obtained by adding −1 to a symbol value can be used in the operations. That is, when the symbol value is one of ±3 and ±1, a value obtained by adding −1 to the symbol value is one of values 2, 0, −2 and −4. These values are represented by $2^1$, $1^0$, $-2^1$ and $-2^2$. Thus, the operations are carried out by using the value obtained by adding −1 to the symbol value in the same manner as in a case where the value obtained by adding +1 to the symbol value is used. In this case, it must be considered whether the polarity of DC components is positive or negative.

The present invention is not limited to the aforementioned embodiments, and variations and modifications may be made without departing from the scope of the claimed invention.

What is claimed is:

1. A digital subscriber loop interface unit connected to a digital subscriber loop, comprising:

an echo canceler for carrying out an echo canceling operation;

a decision feedback equalizer for carrying out an equalizing operation; and a low-pass filter to which a signal processed by said echo canceler is supplied and for supplying a signal processed by said low-pass filter to said decision feedback equalizer, said low-pass filter having:

means for changing a filter coefficient in accordance with a length of said digital subscriber loop; and means for changing the filter coefficient based on whether said decision feedback equalizer is in or after a pull-in step.

2. The digital subscriber loop interface unit as claimed in claim 1, wherein the filter coefficient is changed a plurality of times in the low-pass filter from starting the pull-in step to an end of the pull-in step.

3. The digital subscriber loop interface unit as claimed in claim 1, wherein the filter coefficient is a sum of numbers each of which is represented by an exponent of "2".

* * * * *